(12) United States Patent
Leigh et al.

(10) Patent No.: US 10,765,038 B1
(45) Date of Patent: Sep. 1, 2020

(54) FLOATING LIQUID-COOLED COLD PLATE

(71) Applicant: HEWLETT PACKARD ENTERPRISE DEVELOPMENT LP, Houston, TX (US)

(72) Inventors: Kevin B. Leigh, Houston, TX (US); John Norton, Houston, TX (US); Everett Salinas, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/525,854

(22) Filed: Jul. 30, 2019

(51) Int. Cl.
G06F 1/20 (2006.01)
H05K 7/20 (2006.01)
H05K 7/14 (2006.01)

(52) U.S. Cl.
CPC .......... *H05K 7/20772* (2013.01); *G06F 1/20* (2013.01); *H05K 7/1489* (2013.01)

(58) Field of Classification Search
CPC ..... H01L 23/473; H01L 23/427; H01L 23/34; H01L 23/40; H05K 7/20772; H05K 7/20509; H05K 7/20281; H05K 7/023; G06F 1/20; G06F 2200/201; G06F 2200/1635; F28D 1/0443
USPC ................ 361/702, 704, 700, 698, 699, 721
See application file for complete search history.

(56) References Cited

U.S. PATENT DOCUMENTS

| | | |
|---|---|---|
| 5,473,506 A | 12/1995 | Kikinis |
| 6,784,837 B2 | 8/2004 | Revankar et al. |
| 6,989,990 B2 | 1/2006 | Malone et al. |
| 7,133,285 B2 | 11/2006 | Nishimura |
| 7,961,465 B2 | 6/2011 | Goldrian et al. |
| 8,879,257 B2 | 11/2014 | Campbell et al. |
| 9,185,830 B2 | 11/2015 | Chainer et al. |
| 9,435,590 B2 | 9/2016 | Stellman |
| 10,058,009 B2 | 8/2018 | Huang et al. |
| 2002/0114139 A1* | 8/2002 | Bash ............... H05K 7/20772 361/719 |
| 2017/0142864 A1 | 5/2017 | Chanu et al. |
| 2019/0045656 A1 | 2/2019 | Chen et al. |

* cited by examiner

*Primary Examiner* — Mandeep S Buttar
(74) *Attorney, Agent, or Firm* — Nolte Intellectual Property Law Group

(57) ABSTRACT

A system may include a component cage to house a heat-generating component, a cold plate assembly, and a mounting mechanism. The cold plate assembly may include a cold plate having a mating surface and a non-mating surface, the mating surface to contact a thermal transfer device of a heat-generating component installed in the component cage. The mounting mechanism movably mounts the cold plate to the component cage with the non-mating surface facing a surface of the component cage located in a first plane. The mounting mechanism allows the cold plate to move from a first orientation to a second orientation as the heat-generating component is being installed in the component cage. In the first orientation, the mating surface is inclined relative to the first plane. In the second orientation, the mating surface is parallel to the first plane when the heat-generating component is installed in the component cage.

22 Claims, 20 Drawing Sheets

FLOATING LIQUID-COOLED COLD PLATE

BACKGROUND

Pluggable modules, such as memory and storage components, are inserted into slots within component cages generate heat during their operation. Accordingly, for performance and to prevent damage to the pluggable modules, cooling systems have been implemented to maintain the pluggable modules at acceptable operational temperatures. As the speeds and power consumption expectations of these pluggable modules continue to increase, and as more component cages are placed within a given equipment chassis, an expected challenge is removal of the heat generated by the pluggable modules operating within these chassis.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. Features of the present disclosure are illustrated by way of example and not limited in the following figures, in which like numerals indicate like elements, in which.

DETAILED DESCRIPTION

Figure 1:
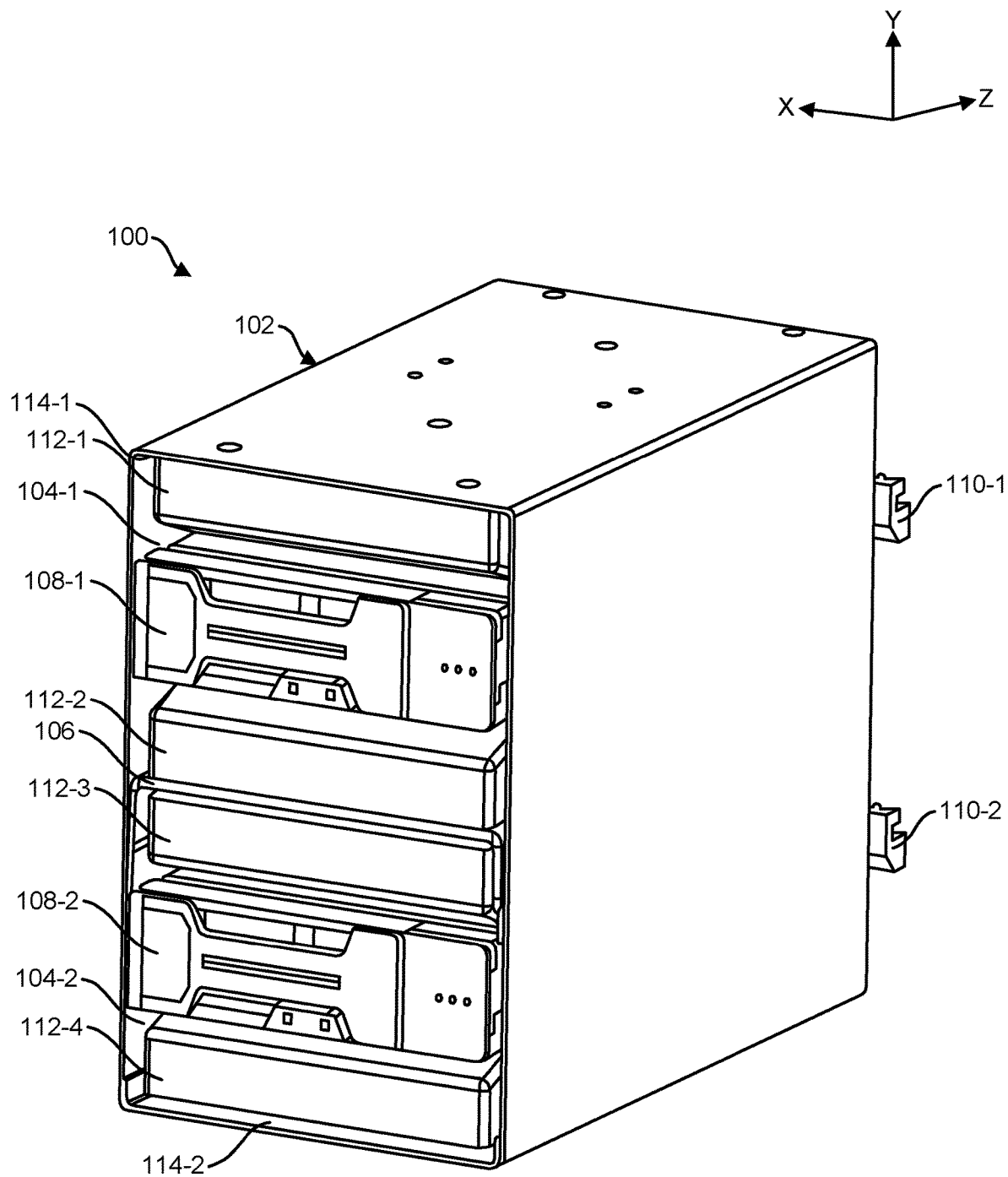
FIG. 1 depicts a computing device that includes a liquid-cooled cold plate assembly, according to one or more examples of the present disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

There are challenges in designing a cooling system that uses liquid-cooled cold plates for a plurality of pluggable modules housed within component cages within an equipment chassis. One challenge is balancing parameters to minimize the profile (for space savings) while maximizing contact between surfaces of the pluggable modules and the liquid-cooled cold plates. The "profile" of the system refers to the height of the component cage with the mounted one or more cold plates and one or more installed pluggable modules. Disclosed herein are systems that include one or more floating liquid-cooled cold plates, also referred to herein as "cold plates." Further disclosed herein are computing devices having one or more floating cold plates. Further disclosed herein is a method of operation of a one or more floating cold plates mounted within a component cage.

In one implementation, a system includes a component cage, a cold plate assembly, and a mounting mechanism. The component cage includes one or more bays to house one or more heat-generating components. The cold plate assembly includes one or more cold plates. At least one cold plate is a "floating" cold plate relative to a surface of the component cage to which it is mounted, also referred to herein as a "mounting surface." The mounting surface may be located in a plane referred to herein as a "mounting plane."

"Floating," when used as an adjective to describe a cold plate, means that the cold plate is constructed such that, when mounted, it may be moved from a first orientation that is inclined relative to the mounting plane to a second orientation that is parallel relative to the mounting plane. The first orientation is also referred to as an "inclined" or "resting orientation and is the orientation in which a cold plate is biased when a heat-generating component is not installed in the component cage. The second orientation is the orientation in which a cold plate is biased when a heat-generating component is fully installed in the component cage. "Floating" when used as a verb (e.g., the cold plate is floating or floating the cold plate) means that the cold plate is biased or being biased in the inclined or resting orientation, and the cold plate may be moved to be biased in the mated orientation as a heat-generating component is installed in the component cage.

A cold plate may have a mating surface and a non-mating surface, which are opposing sides or faces of the cold plate. Alternatively, the cold plate may have two mating surfaces, which are opposing sides or faces of the cold plate. The "mating" surface contacts a heat-generating component when the heat-generating component is installed in the component cage. For example, the mating surface contacts a thermal transfer device of the heat-generating component. The "non-mating" surface faces the mounting surface of the component cage when the cold plate is mounted in the component cage.

The mounting mechanism movably mounts each floating cold plate into the component cage to control movement from the resting orientation to the mated orientation as a heat-generating component is being installed in the component cage. An implementation of the mounting mechanism includes a plurality of posts and a plurality of spring mechanisms, such as leaf spring mechanisms. The plurality of posts may be attached to the mounting surface of the component cage to mount the floating cold plate to the component cage through a corresponding plurality of holes in the floating cold plate. The plurality of spring mechanisms may be disposed between the non-mating surface of the floating cold plate and the mounting surface of the component cage.

In one example, the system includes one floating cold plate. In another example, the system includes two floating cold plates. In still another example, the system includes one floating cold plate and one fixed cold plate. In yet another example, the system includes two floating cold plates and one fixed cold plate disposed between the two floating cold plates.

In another implementation, a computing device includes a component cage with one or more bays to house pluggable modules and a cold plate assembly having a cold plate. The cold plate has a mating surface to contact and cool one of the pluggable modules when the pluggable module is installed in one of the bays. The cold plate is movably mounted to the component cage such that the mating surface is inclined relative to a mounting plane when the pluggable module is not installed in the bay, and the pluggable module moves the cold plate as the pluggable module is inserted into the bay such that the mating surface is parallel to the mounting plane when the pluggable module is fully installed.

In another implementation, a method of operation of a cold plate assembly mounted within a component cage includes floating a cold plate of the cold plate assembly in an angled plane relative to a mounting surface of the component cage to which the cold plate is mounted. The method further includes moving the cold plate relative to an axis that is perpendicular to the mounting surface of the component cage. The moving is during installation of a heat-generating component into the component cage. The method also includes fixing the cold plate in a parallel plane relative to the mounting surface of the component cage to contact a mating surface of the cold plate to a first surface of the heat-generating component once installed.

The floating cold plate being movable in an inclined plane relative to the mounting surface as a pluggable module is being installed reduces friction between the floating cold plate and the pluggable module during installation. Once fully installed, the mating surface of the floating cold plate being parallel to a surface of the pluggable module increase contact area between the surfaces and thereby to improve heat extraction, while reducing the profile of the system.

Turning now to the drawings, FIG. 1 depicts a partially assembled computing device 100 that includes a cold plate assembly, according to one or more examples of the present disclosure. Computing device 100 includes a component cage 102 having bays 104-1 and 104-2 to house pluggable modules. A bay separator 106, of the component cage 102, separates the bays 104-1 and 104-2. The computing device 100 further includes pluggable modules 108-1 and 108-2 (also referred to collectively as pluggable modules 108 or individually and generally as a pluggable module 108), connectors 110-1 and 110-2 (also referred to collectively as connectors 110 or individually and generally as a connector 110), and a cold plate assembly having cold plates 112-1, 112-2, 112-3, and 112-4 (also referred to collectively as cold plates 112 or individually and generally as a cold plate 112). One or more of the cold plates 112 may be a floating cold plate.

A "bay" is a compartment within a component cage for receiving and housing one or more pluggable module and one or more cold plates. A "slot" is an area or space within a bay into which the pluggable module may be inserted, and may be formed by one or more mounted cold plates. Herein, a pluggable module referred to as being inserted or installed in a component cage or inserted or installed into a bay of the component cage means that the pluggable module is inserted within a slot formed in a bay of a component cage.

As illustrated, the cold plates 112-1 and 112-2 are longitudinally mounted along an XZ-plane within the bay 104-1. Particularly, a non-mating surface (not shown) of the cold plate 112-1 is mounted to an inner surface 114-1 of the component cage 102. A non-mating surface (not shown) of the cold plate 112-2 is mounted on one side of the bay separator 106. The pluggable module 108-1 is fully installed between the cold plates 112-1 and 112-2. Accordingly, a mating surface (not shown) of the cold plate 112-1 is parallel to the XZ-plane and contacts a surface (not shown) of the pluggable module 108-1. Also, a mating surface (not shown) of the cold plate 112-2 is parallel to the XZ-plane and contacts an opposing surface (not shown) of the pluggable module 108-1.

The cold plates 112-3 and 112-4 are longitudinally mounted along the XZ-plane within the bay 104-2. The XZ-plane is considered a mounting plane. Particularly, a non-mating surface (not shown) of the cold plate 112-4 is mounted to an inner surface 114-2 of the component cage 102. A non-mating surface (not shown) of the cold plate 112-3 is mounted to an opposing side of the bay separator 106. The pluggable module 108-2 is fully installed between the cold plates 112-3 and 112-4. Accordingly, a mating surface (not shown) of the cold plate 112-3 is parallel to the XZ-plane and contacts a surface (not shown) of the pluggable module 108-2. Also, a mating surface (not shown) of the cold plate 112-4 is parallel to the XZ-plane and contacts an opposing surface (not shown) of the pluggable module 108-2. When a pluggable module 108 is "fully installed" within a bay of the component cage 102, the pluggable module 108, e.g., through one or more electrical and/or optical contacts (not shown), electrically and/or optically connects to the connector 110 to send and/or receive power and management signals, high-speed signals, etc.

The "pluggable modules" described herein (including the pluggable modules 108, 208, 808, 908, 1208, 1304, 1608, and 1708) include computing components that are designed to be easily plugged into and removed from a system by a user during normal usage. Such pluggable modules generally include features to enable easy installation/removal, such as blind-mate electrical connectors (e.g., electrical contacts 208-5) that allow the module to be electrically connected into the system without the user needing to directly observe/control the mating of the electrical connectors. In some examples, the pluggable modules are hot-pluggable, meaning they can be plugged into or removed from a system while the system is running without requiring a system restart.

The pluggable modules may also include a case to support and protect the computing components. The case may also be described as a carrier, tray, a housing, or the like. In some examples, the case may include features to aid in the insertion or removal of the module into or out of the bay, such as guide rails or tabs. In some examples, the case may also include features to secure the modules in the bay, such as a latch, and features to initiate a safe removal of the module from the system, such as a release button. In some examples, portions of the case may also serve as a thermal interface that contacts the cold plates to transfer heat generated by the module into the cold plates.

The pluggable modules generate heat when operated, and thus are also referred to herein as "heat-generating" components. For example, the pluggable module may be a memory module, a storage module (e.g., a solid state drive (SSD), hard disk drive (HDD), etc.), a graphics processing unit, an artificial intelligence module, a machine learning module, an optical transceiver module, a switch module, an accelerator module, etc. The pluggable module may use any convenient form factor (e.g., EDSFF—Enterprise & Datacenter SSD Form Factor, VPX—VME International Trade Association's VITA 46) and communications interfaces (e.g., I2C, M.2, U.2, PCIe, SATA, SAS, Ethernet, Infiniband, Gen-Z, etc.)

Figure 2:
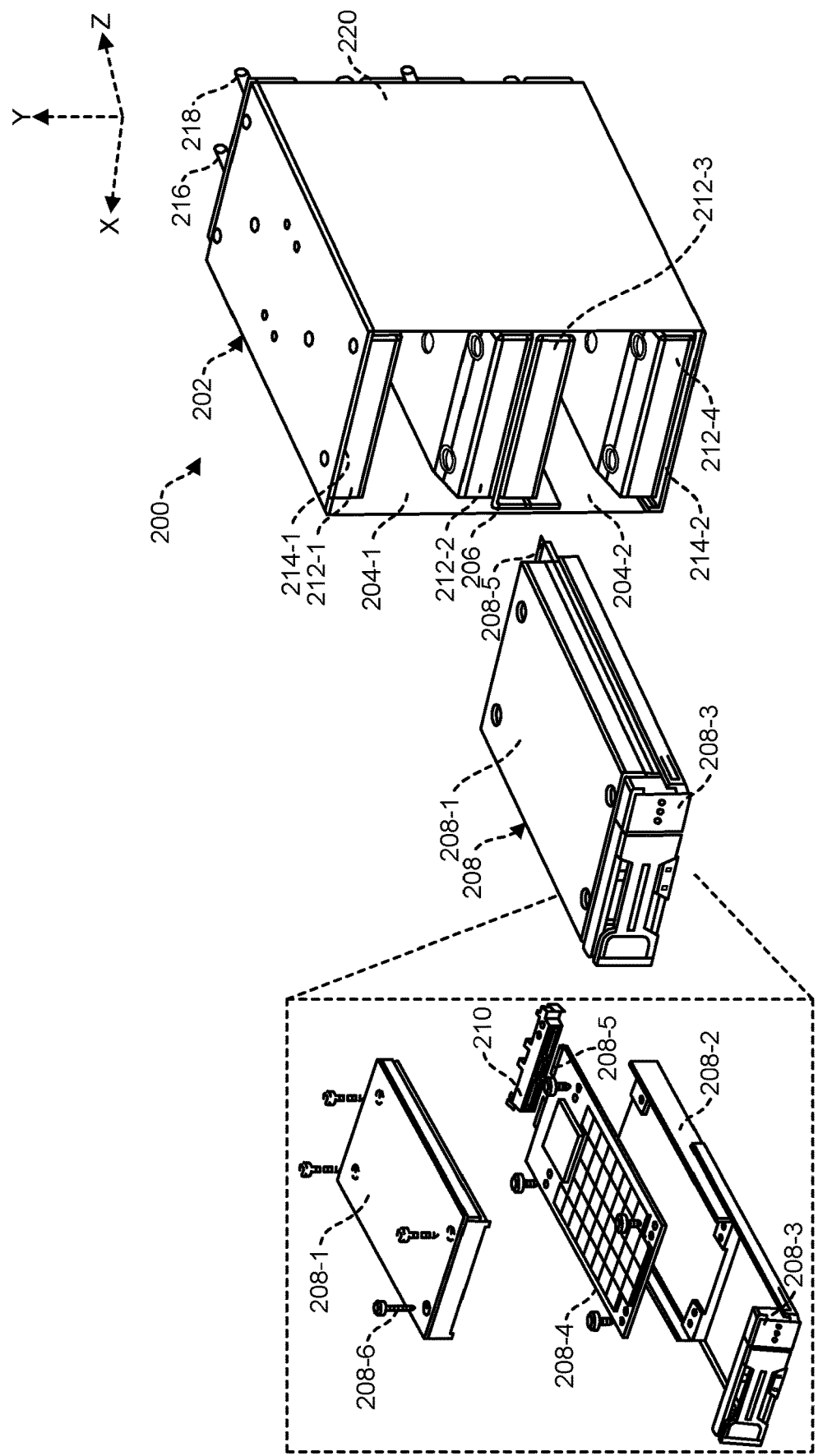
FIG. 2 depicts a system that includes a liquid-cooled cold plate assembly, according to one or more examples of the present disclosure.

FIG. 2 depicts a partially disassembled system 200 that includes a cold plate assembly, according to one or more examples of the present disclosure. System 200 includes a component cage 202 having bays 204-1 and 204-2 to house pluggable modules. A bay separator 206, of the component cage 202, separates the bays 204-1 and 204-2. The system 200 further includes a cold plate assembly having cold plates 212-1, 212-2, 212-3, and 212-4 (also referred to collectively as cold plates 212 or individually and generally as a cold plate 212). One or more of the cold plates 212 may be a "floating" cold plate as described herein. Further included in the system 200 are liquid coolant supply lines, also referred to as "supply lines," 216 (with only one labeled) and liquid coolant return lines, also referred to a "return lines," 218 (with only one labeled). The supply lines 216 couple to inlets (not shown) formed in or coupled to the cold plates 212. The return lines 218 couple to outlets (not shown) formed in or coupled to the cold plates 212.

As illustrated, the cold plates 212-1 and 212-2 are longitudinally mounted along an XZ-plane within the bay 204-1. The XZ-plane is considered a mounting plane. Particularly, a non-mating surface (not shown) of the cold plate 212-1 is mounted to an inner surface 214-1 of the component cage 202. A non-mating surface (not shown) of the cold plate 212-2 is mounted on one side of the bay separator 206. The cold plates 212-3 and 212-4 are longitudinally mounted along the XZ-plane within the bay 204-2. Particularly, a non-mating surface (not shown) of the cold plate 212-4 is mounted to an inner surface 214-2 of the component cage 202. A non-mating surface (not shown) of the cold plate 212-3 is mounted to an opposing side of the bay separator 206. The mounting surfaces 214-1 and 214-2 are also referred to collectively as mounting surfaces 214 or individually and generally as a mounting surface 214. The inner surfaces 214-1, 214-2 and the opposing sides of the bay separator are considered mounting surfaces.

A pluggable module 208 may be installed in each of the bays 204 between the respective cold plates 212 mounted within the bay 204. The pluggable module 208 may be any type of module that generates heat when operated, and is therefore also referred to as a "heat-generating" component. For example, the pluggable module 208 may be a memory module, a storage module, a graphics processing unit, an artificial intelligence or machine learning module, an optical transceiver module, etc.

As illustrated, the pluggable module 208 includes lateral panels 208-1 and 208-2 encasing a printed circuit assembly (PCA) 208-4 containing electronics or circuitry. One or both of the lateral panels 208-1, 208-2 may be or serve as a heat transfer device. A "heat transfer device" is a device that receives heat from one solid body via conduction (contact) and transfers the heat to a second solid body via conduction (contact). In an example, the lateral plates 208-1 and 208-2 are heat spreaders. Screws 208-6 (only one labeled), or any suitable securing mechanism such as posts and snap-rings for instance, secure the lateral panels 208-1 and 208-2 to the PCA 208-4, to which a front panel 208-3 may be slidably attached. In this example, an end of the PCA 208-4 exposes one or more electrical contacts 208-5 to electrically connect to a connector 210 of the system 200 when the pluggable module 208 is fully installed in the component cage 202. The connector 210 may allow power to be provided to the pluggable module 208 and/or data to be exchanged with the pluggable module 208.

In FIG. 2, the connector 210 is shown outside of the bay 204 to make it visible, but in practice the connector 210 may be housed within the bay 204 at a location that enables it to mate with the electrical contacts 208-5 when the pluggable module 208 is inserted into a slot of the bay 204. Additionally, FIG. 2 shows a module 208 example with an electrical connector that may be used for power delivery, a management signal interface, and a high-speed signal interface. In other examples, an optical connector may be used for high-speed signals in addition to an electrical connector for power delivery and management signals.

During operation of the pluggable module 208, while installed in the component cage 202, the electronics of the pluggable module 208 may generate heat. The heat may be transferred from the electronics to the panels 208-1 and 208-2 to the cold plates 212 contacting the panels 208-1 and 208-2. The cold plates 212 receive the heat through conduction (contact) and dissipate the heat into liquid coolant flowing through the cold plates 212 as described below, to cool the pluggable module 208.

Figure 3:
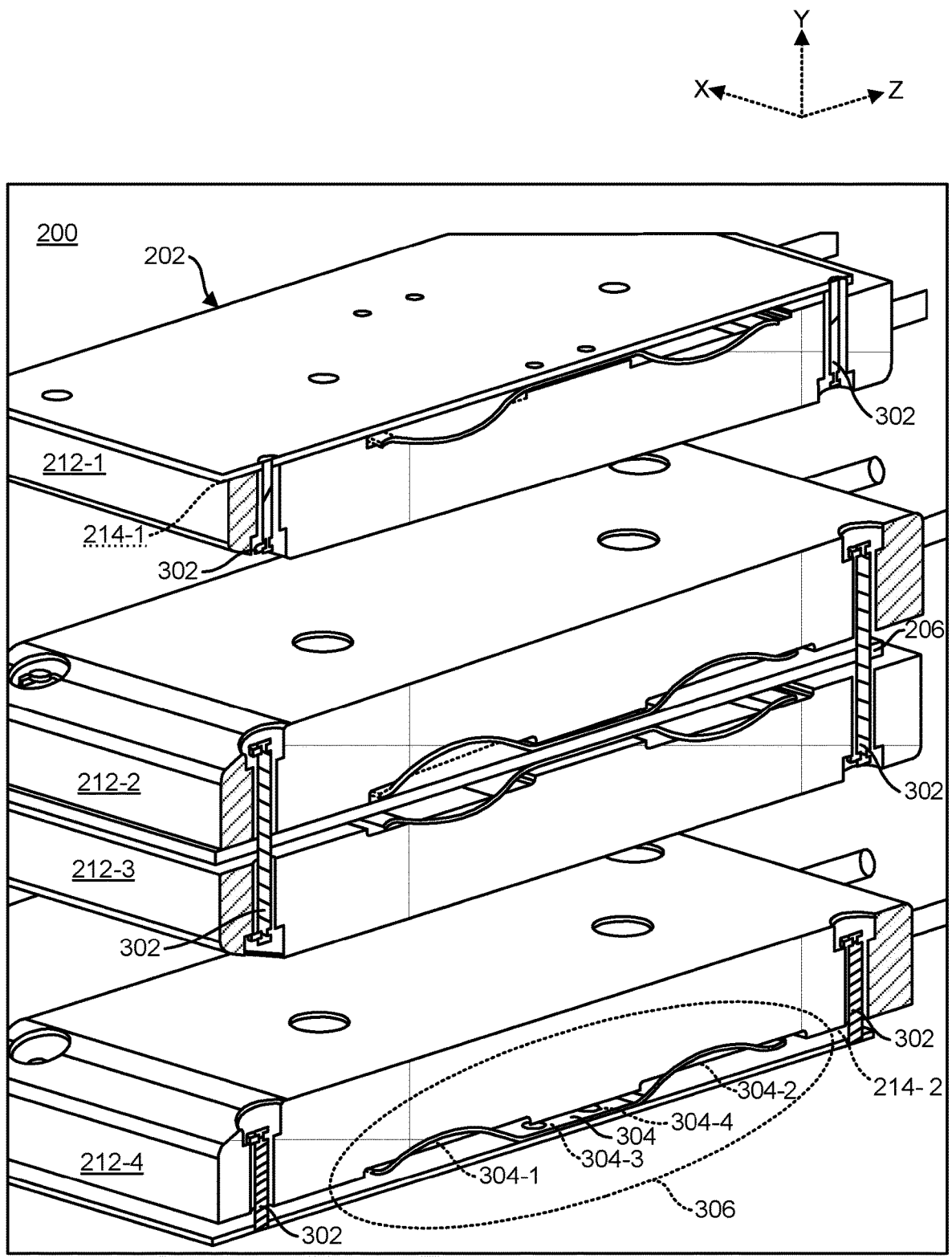
FIG. 3 depicts a cut-away view of the system depicted in FIG. 2, according to one or more examples of the present disclosure.

FIG. 2 illustrates an example system 200 where all of the cold plates 212 are floating cold plates. FIGS. 3-6 illustrate the mounting mechanism for the cold plates 212, according to one or more examples of the present disclosure. Particularly, FIG. 3 depicts a cut-away view from a side 220 of the system 200 depicted in FIG. 2. The partial view 306 illustrates the mounting mechanism that includes a plurality of posts 302 and a plurality of spring mechanisms 304 (only one labeled), where leaf spring mechanisms are also referred to as "leaf springs." However, the spring mechanisms 304 may be any suitable device that provides a spring force. The combination of the posts 302 and spring force or load of the spring mechanisms 304 controls the resting orientation and movement of the floating cold plates 212 along the Y-axis.

As illustrated, the spring mechanisms 304 are positioned between the non-mating surface of the cold plates 212 and the respective mounting surface of the component cage 202 and longitudinally aligned along the Z-axis. Each leaf spring 304 has two leaf spring segments 304-1 and 304-2 and a central segment 304-3 disposed, e.g., formed or attached, between the leaf spring segments 304-1 and 304-2. The leaf springs 304 may be attached, for instance using screws, to the mounting surface 214 through holes 304-4 (one labeled) in the central segment 304-3.

The posts 302 are longitudinally aligned along the Y-axis, which is perpendicular to the mounting plane, which is the XZ-plane. At least some of the posts 302 are attached to mounting surfaces 214-1 and 214-2 and extend through holes in a single cold plate 212-1 or 212-4. Other posts 302, extend through holes in multiple cold plates 212. In the example system 200, the posts 302 extend through both the cold plates 212-2 and 212-3 mounted on the opposing sides of the bay separator 206. The posts 302 may be secured to the mounting surfaces 214 using any suitable means such as press fit, hardware such as screws, etc., which may depend on available space and configuration.

Figure 4:
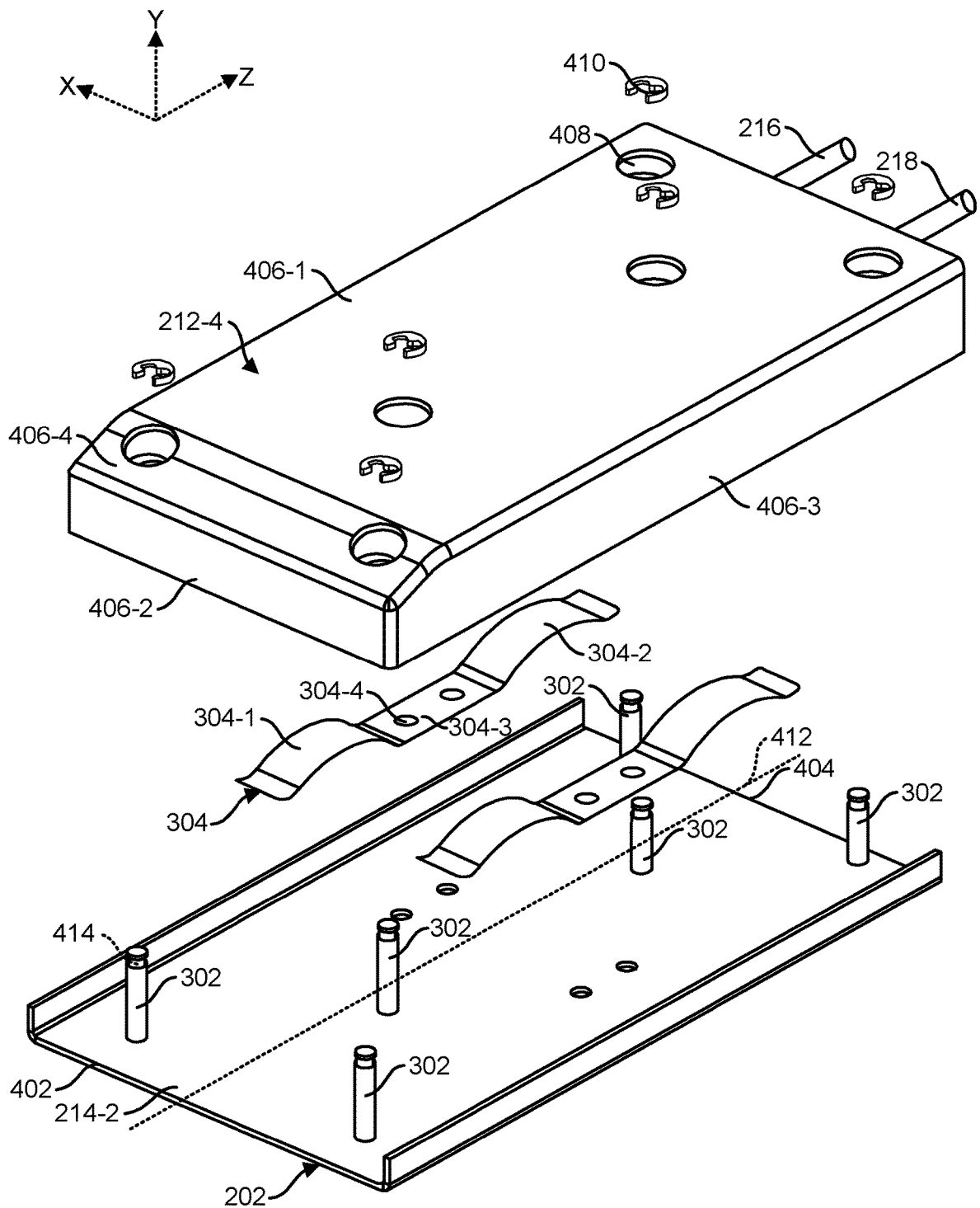
FIG. 4 depicts a mounting mechanism to "float" a liquid-cooled cold plate depicted in FIGS. 2 and 3, according to one or more examples of the present disclosure.

FIG. 4 depicts an exploded view of elements of the mounting mechanism used to float the cold plate 212-4 depicted in FIGS. 2 and 3, according to one or more examples of the present disclosure. This view of the cold plate 212-4 illustrates that it has a plurality of sides that form an enclosure for a liquid coolant provided into the cold plate 212-4 through the supply line 216 and exiting the cold plate 212-4 into the return line 218. For example, the enclosure is or includes a geometry of piping to direct the flow of the liquid coolant. In a particular example, the piping has a serpentine geometry to increase cooling area coverage. The plurality of sides includes a mating surface 406-1 and opposing and parallel non-mating surface (not shown); an anterior side 406-2 and opposing and parallel posterior side (not shown) to which the supply line 216 and return line 218 are coupled; and a lateral side 406-3 and opposing and parallel lateral side (not shown). The mating surface 406-1 and non-mating surfaces are arranged along the XZ-plane. The anterior 406-2 and posterior sides are arranged along an XY-plane, and the lateral side 406-3 and opposing lateral side are arranged along a YZ-plane. The plurality of sides further includes an angled side 406-4 that connects the anterior side 406-2 to the mating surface 406-1.

As illustrated, the mounting mechanism for the cold plate 212-4 includes 6 posts 302, two leaf springs 304 (only one labeled), and six snap-rings 410 (only one labeled). The leaf springs may be high-carbon steel or spring steel, for example. Note that the numbers shown herein are for illustration purposes and that other examples may use other numbers. Two of the posts 302 are attached proximate an anterior end 402 of the mounting surface 214-2 and are arranged along the X-axis. The anterior end 402 forms part of the opening of the component cage 202. Two of the posts 302 are attached proximate a posterior end 404 of the mounting surface 214-2 and are arranged along the X-axis. The anterior end 402 and posterior end 404 are opposing parallel ends of the mounting surface 214-2. The posts 302 attached near the anterior end 402 may have a different length, e.g., shorter, than the posts 302 attached near the posterior end 404. The different lengths of the posts 302 enable the cold plate 212-4 to be biased in the resting orientation, which is angled relative to the mounting surface 214-2, when a pluggable module is not installed in the component cage 202.

The two remaining posts 302 are arranged along a midline 412 of the mounting surface 214-2 between the anterior end 402 and posterior end 404. The posts 302 mount the cold plate 212-4 to the mounting surface 214-2 through holes 408 (only one labeled) aligned with the posts 302. In the illustrated example, the holes 408 that align with the posts 302 proximate the anterior end 402 are formed through the angled side 406-4 of the cold plate 212-4. The snap-rings 410 engage with snap-ring collars 414 (only one labeled) formed in the posts 302 to secure the cold plate 212-4 to the mounting surface 214-2.

Each leaf spring 304 has the two leaf spring segments 304-1 and 304-2. The leaf spring segments 304-1 and 304-2 each have a spring force, which may be the same or different. The spring force may be measured in pounds, for example. Each leaf spring 304 also has the central segment 304-3 disposed, e.g., formed or attached, between the leaf spring segments 304-1 and 304-2. The leaf springs 304 may be attached to the mounting surface 214-2 through the holes 304-4 (only one labeled) in the central segment 304-3. The leaf springs 304 are disposed between the non-mating surface of the cold plate 212-4 and the mounting surface 214-2 and are longitudinally arranged in parallel along the XZ-plane. In the illustrated example, the leaf springs 304 are arranged on opposing sides of the centrally positioned posts 302 and are arranged between the posts 302 positioned proximate the anterior end 402 and posterior end 404 of the mounting surface 214-1. Accordingly, the cold plate 212-4 is spring loaded on the non-mating surface to enable movement of the cold plate 212-4 primarily along the Y-axis, with limited movement along the Z-axis. The spring loading may also enable an even and constant pressure to be applied to the surface of a fully installed pluggable module to increase the contact between a cold plate and a surface of a pluggable module, such as a surface of a heat transfer device of the pluggable module.

Figure 5:
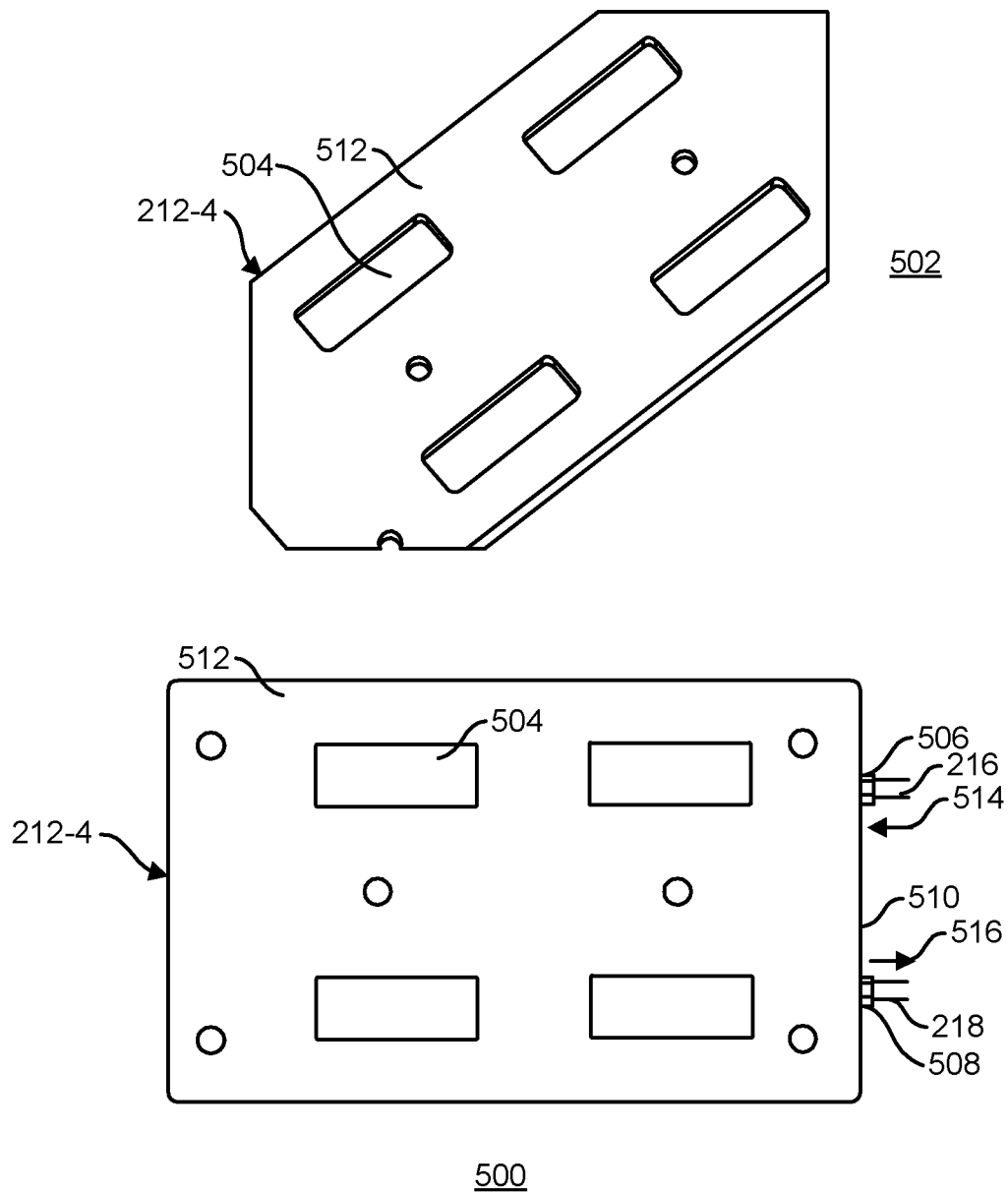
FIG. 5 depicts a non-mating surface of the liquid-cooled cold plate depicted in FIGS. 2, 3, and 4 according to one or more examples of the present disclosure.

FIG. 5 depicts a non-mating surface 512 of the cold plate 212-4 of FIGS. 2, 3, and 4 according to one or more examples of the present disclosure. The non-mating surface 512 includes a plurality of recesses 504 (only one labeled) formed, e.g., milled, in the non-mating surface 512 to receive the leaf springs. Namely, the recesses align with and receive the leaf spring segments 304-1 and 304-2 of each leaf spring 304. A view 502 illustrates a depth of the plurality of recesses. In an example, the depth enables contact between the leaf spring segments 304-1, 304-2 with the non-mating surface 512 when the cold plate 212-4 is in the resting orientation without the non-mating surface applying a significant counter force on the leaf spring segments 304-1, 304-2. A view 500 illustrates an inlet 506 and an outlet 508 formed in or coupled to a posterior side 510 of the cold plate 212-4. The inlet 506 receives liquid coolant into the cold plate 212-4 from the supply line 216 coupled thereto, as illustrated by an arrow 514. The outlet 508 provides liquid coolant from the cold plate 212-4 to the return line 218 coupled thereto, as illustrated by an arrow 516.

Figure 6:
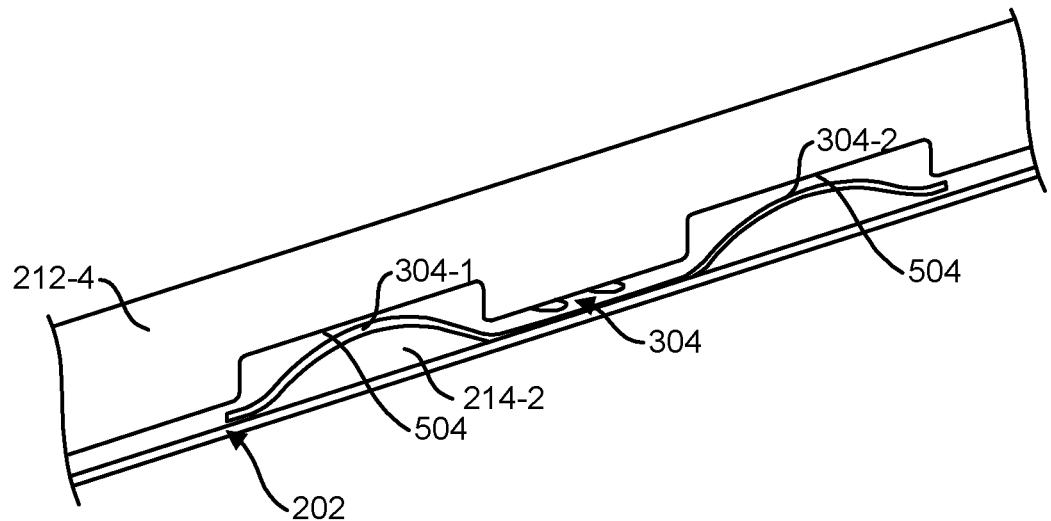
FIG. 6 depicts a side view of a leaf spring mechanism seated within a recess of a non-mating surface of a liquid-cooled cold plate depicted in FIGS. 2-5, according to one or more examples of the present disclosure.

FIG. 6 depicts a partial view 306 of the system 200 depicted in FIG. 3, according to one or more examples of the present disclosure. View 306 illustrates a side view of the leaf spring 304 positioned between a non-mating surface (not shown) of the cold plate 212-4 and the mounting surface 214-2 of the component cage 202. Particularly, leaf spring segments 304-1, 304-2 of the leaf spring 304 are seated in aligned recesses 504 of the non-mating surface. The arrangement of the leaf spring 304 within the recesses 404 allows maximum Y-axial movement and also, along with the length of the posts 304, controls the leaf spring 304 travel along the Y-axis during installment of a pluggable module.

Figure 7:
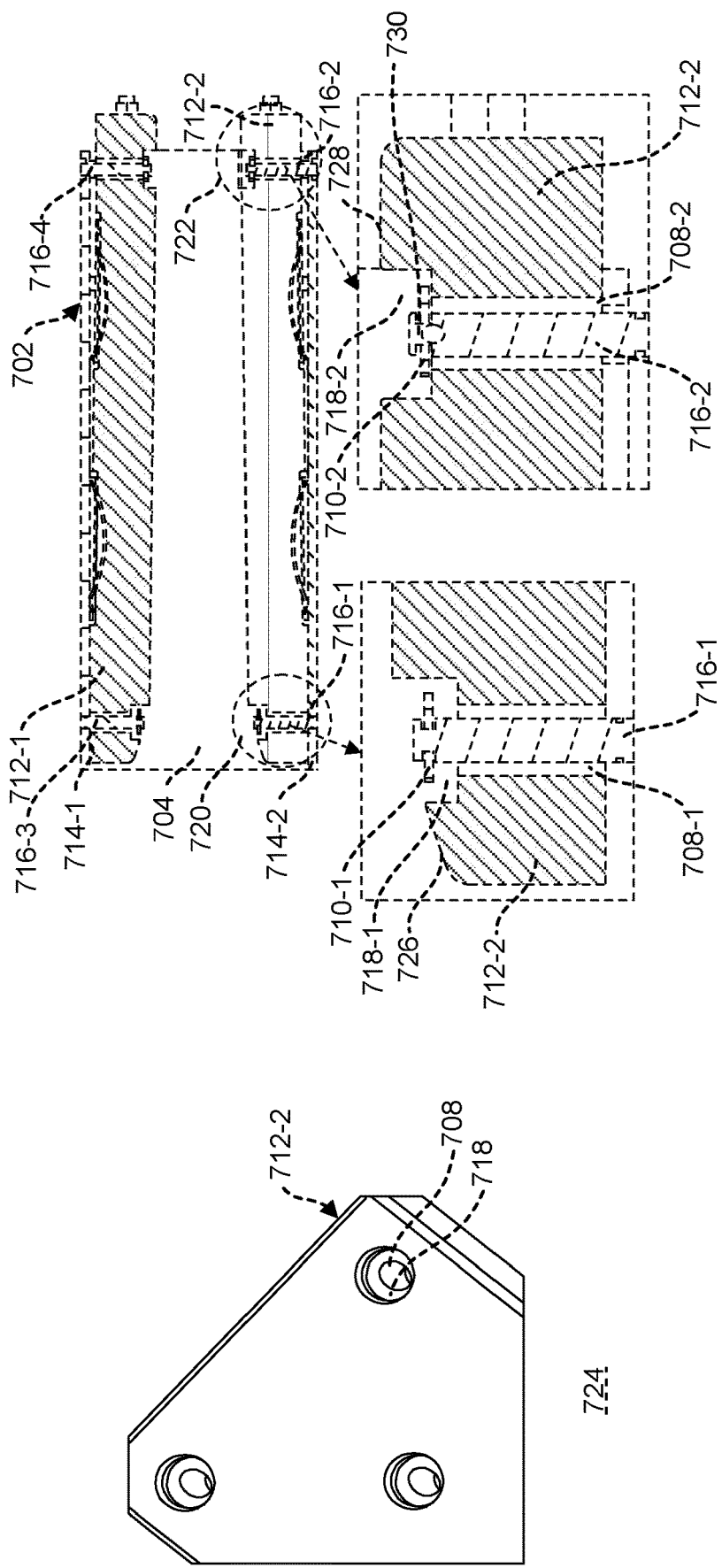
FIG. 7 depicts an arrangement of posts to mount floating liquid-cooled cold plates within a bay of a component cage, according to one or more examples of the present disclosure.

FIG. 7 depicts an arrangement of posts to mount floating cold plates 712-1 and 712-2 within a bay 704 of a component cage 702, according to one or more examples of the present disclosure. The posts include posts 716-1, 716-2, 716-3, and 716-4 are collectively referred to as posts 716 and are also referred to generally as a post 716. Posts 716-3 and 716-4 mount the cold plate 712-1 to a mounting surface 714-1 of the component cage 702. Posts 716-1 and 716-2 mount the cold plate 712-2 to a mounting surface 714-2 of the component cage 702. Cold plates 712-1 and 712-2 are collectively referred to as cold plates 712 and are also referred to generally as a cold plate 712.

An exploded view 720 illustrates, in additional detail, the post 716-1 mounted through a hole 708-1 formed in the cold plate 712-2. In the example, the hole 708-1 is centered within a recess 718-1 formed in the cold plate 712-2. In this illustrated example, the recess 718-1 is formed in an angled side 726 of the cold plate 712-2.

An exploded view 722 illustrates, in additional detail, the post 716-2 mounted through a hole 708-2 formed in the cold plate 712-2. In the example, the hole 708-2 is centered within a recess 718-2 formed in the cold plate 712-2. In the illustrated example, the recess 718-2 is formed in a mating side 728 of the cold plate 712-2. The hole 708-1 may have a shorter length than the hole 708-2 to respectively accommodate the post 716-1 having a shorter length than the post 716-2. As earlier mentioned, the different sized posts enable a cold plate to be biased in an angled plane relative to the mounting surface. Similarly, the post 716-3 and hole through which it extends may have a shorter length than the post 716-4 and hole through which it extends.

A hole 708 and recess 718 are illustrated in a partial top down perspective view 724 of the cold plate 712-2, being unmounted. The hole 708 also collectively refers to all of the holes within the cold plates 712-1 and 712-2, including holes 708-1 and 708-2. The recess 718 also collectively refers to all of the recesses within the cold plates 712-1 and 712-2, including recesses 718-1 and 718-2. The holes 708 may be "oblong-shaped" or having a cross-section having an oblong shape, and have a larger diameter than a diameter of the posts 716. The larger diameter of the oblong-shaped holes 708 allows the cold plates 712 to freely move at an angled plane about the posts 716 as a pluggable module is being installed. Additionally, the recesses 718 have a larger diameter then the oblong-shaped holes 708 so that a snap-ring, e.g., snap-rings 710-1 and 710-2, may sit within the recess 718, e.g., 718-1 and 718-2, respectively, when the snap-ring is engaged with a snap-ring collar 730 of a post 716.

Figure 8:
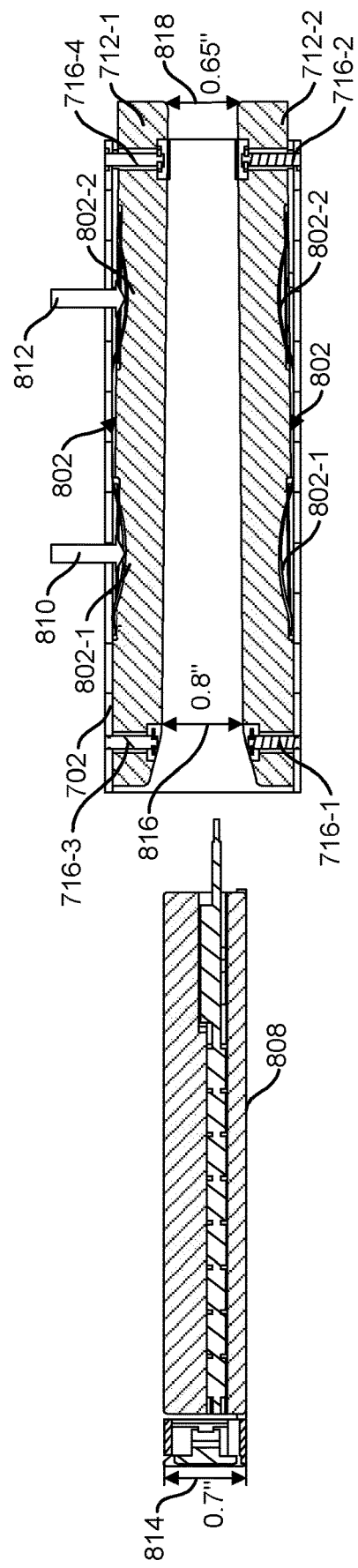
FIG. 8 depicts a side view of a resting orientation of the floating liquid-cooled cold plates mounted within the component cage depicted in FIG. 7, according to one or more examples of the present disclosure.

FIG. 8 depicts a side view of the floating cold plates 712 mounted within the component cage 702 depicted in FIG. 7 in a resting orientation, according to one or more examples of the present disclosure. Illustrated are leaf springs 802, each positioned between the non-mating surface of a cold plate 712 and a mounting surface of the component cage 702. Each leaf spring 802 includes leaf spring segments 802-1 and 802-2. The leaf spring segments 802-1 have a spring force illustrated by an arrow 810. The leaf spring segments 802-2 have a spring force illustrated by an arrow 812. In an example the spring force illustrated by the arrow 810 is four pounds, and the spring force illustrated by the arrow 812 is five pounds.

Further illustrated is a pluggable module 808 that is not installed in the component cage 702 in a slot between the pluggable modules 712. The pluggable module 808 has a thickness or height illustrated by a dimensional arrowed line 814. In an example, the pluggable module 808 has a thickness of 0.7 inches. In the resting orientation, the different spring forces of the leaf spring segments 802-1 and 802-2 angle each cold plate 712 relative to the respective mounting surfaces. Accordingly, a gap (indicated by a dimensional arrowed line 818) between posterior edges of the mating surfaces of the cold plates 712 is shorter than a gap (indicated by a dimensional arrowed line 816) between anterior edges of the mating surfaces of the cold plates 712. In an example, the gap 818 is 0.65 inches, and the gap 816 is 0.8 inches. The gap 810 being larger than the pluggable module 808 thickness may allow reduced friction between the surfaces of the pluggable module 808 and the mating surfaces of the cold plates 712 as the pluggable module 808 is inserted. Additionally, the posts 716 having different heights may allow 0.06-0.68 inches of travel between the posts 716-1 and 716-2 and between the posts 716-3 and 716-4. This vertical travel allows movement of the cold plates 712 until the pluggable module is fully inserted, when the gaps 816 and 818 are equivalent to the thickness of the pluggable module 808. Note that other examples may use other dimensions.

Figure 9:
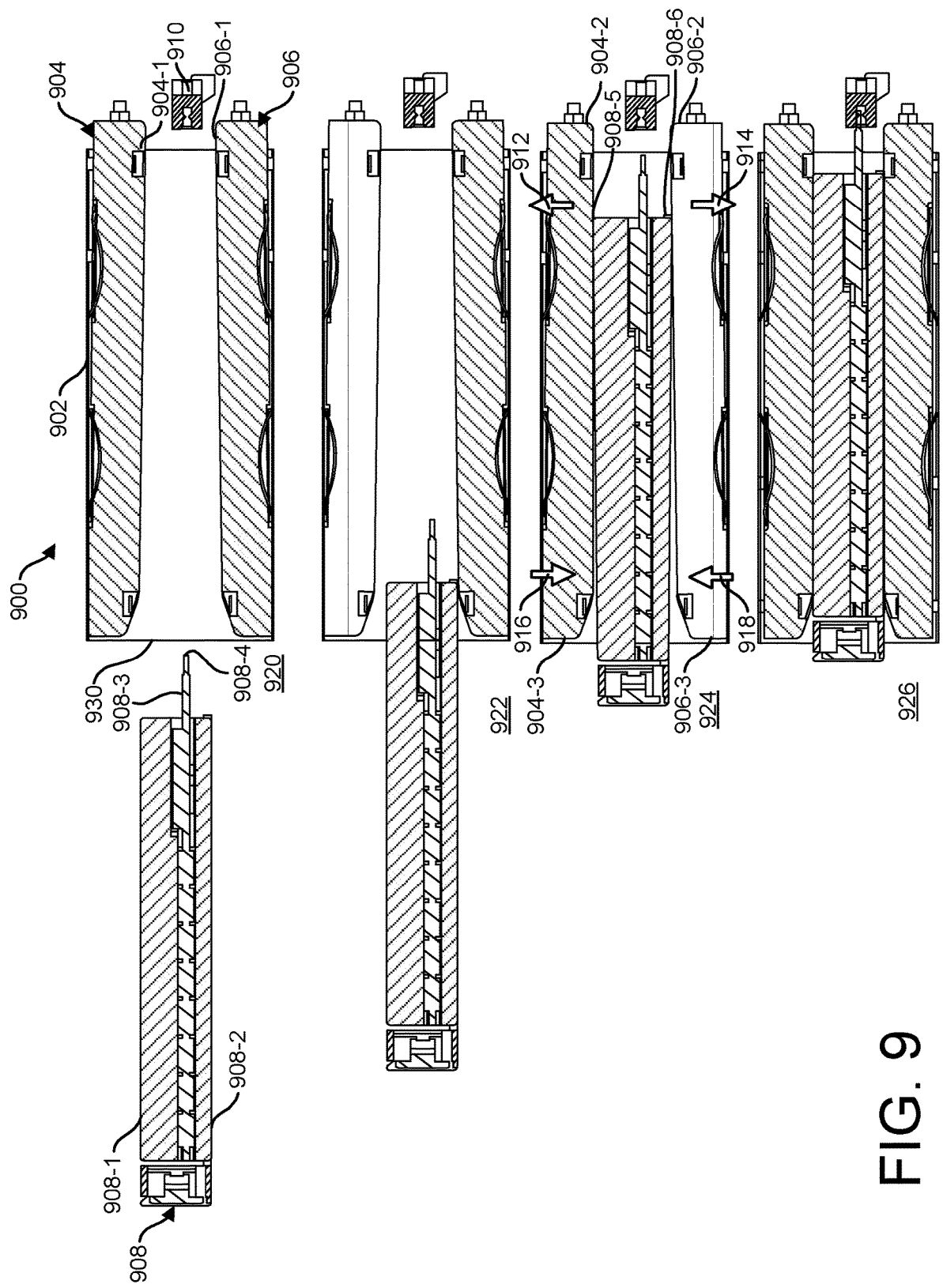
FIG. 9 depicts side views of a pluggable module being installed within a computing device having a liquid-cooled cold plate assembly, the installing without using guide rails, according to one or more examples of the present disclosure.

FIG. 9 depicts side views 920, 922, 924, and 926 of a pluggable module 908 being installed, without using guide rails, within a computing device 900 having a cold plate assembly, according to one or more examples of the present disclosure. As illustrated, the computing device 900 includes a component cage 902, a cold plate assembly having floating cold plates 904 and 906 mounted within the component cage 902, and a connector 910. The floating cold plates 904 and 905 are also referred to as "cold plates." The cold plate 904 has a mating surface 904-1. The cold plate 906 has a mating surface 906-1. The pluggable module 908 includes panels 908-1 and 908-2, e.g., heat transfer devices, encasing a PCA 908-3 containing electronics or circuitry. An end of the PCA 908-3 exposes one or more electrical contacts 908-4 to electrically connect to the connector 910 when the pluggable module 908 is fully installed within the component cage 902.

The view 920 illustrates the floating cold plates 904, 906 in a resting orientation prior to the pluggable module 908 being inserted through an opening 930 of the component cage. The view 922 illustrates a surface of the panel 908-2 of the pluggable module 908 resting on or engaging the mating surface 906-1 of the cold plate 906 upon initial insertion into the component cage 902. The pluggable module 908 may rest on the mating surface 906-1 of the cold plate 906 until the insertion point as illustrated by the view 924.

The view 924 illustrates the pluggable module 908 inserted further into the component cage 902, with a posterior edge 908-5 of the panel 908-1 contacting the mating surface 904-1 of the cold plate 904 and a posterior edge 908-6 of the panel 908-2 contacting the mating surface 906-1 of the cold plate 906. In an example, this contact occurs between 80-85% (and in a particular example 83%) of the distance from the position of ends of the panels 908-1, 908-2 when entering the component cage opening 930 to the position of the ends of the panels 908-1, 908-2 when the pluggable module 908 is fully installed. Upon contact, posterior ends 904-2, 906-2 of the respective cold plates 904, 906 are spread open as indicated by arrows 912 and 914. Simultaneously, anterior ends 904-3, 906-3 of the respective cold plates 904, 906 are brought closer together as indicated by arrows 916 and 918. The arrows 912-918 indicate a direction orthogonal to mounting surfaces of the component cage. This movement of the cold plates 904, 906 begins to sandwich the inserted pluggable module 908 with increasing pressure. As an example, the mating surfaces 904-1, 906-1 may be inclined away from the panels 908-1, 908-2 at this point of insertion.

The view 926 illustrates the pluggable module 908 fully installed within the component cage 902 to provide full contact between the mating surfaces 904-1, 906-1 and the panels 908-1, 908-2 of the pluggable module 908. As illustrated, when fully installed, the electrical contacts 908-4 to of the pluggable module 908 electrically connect to the connector 910.

Figure 10:
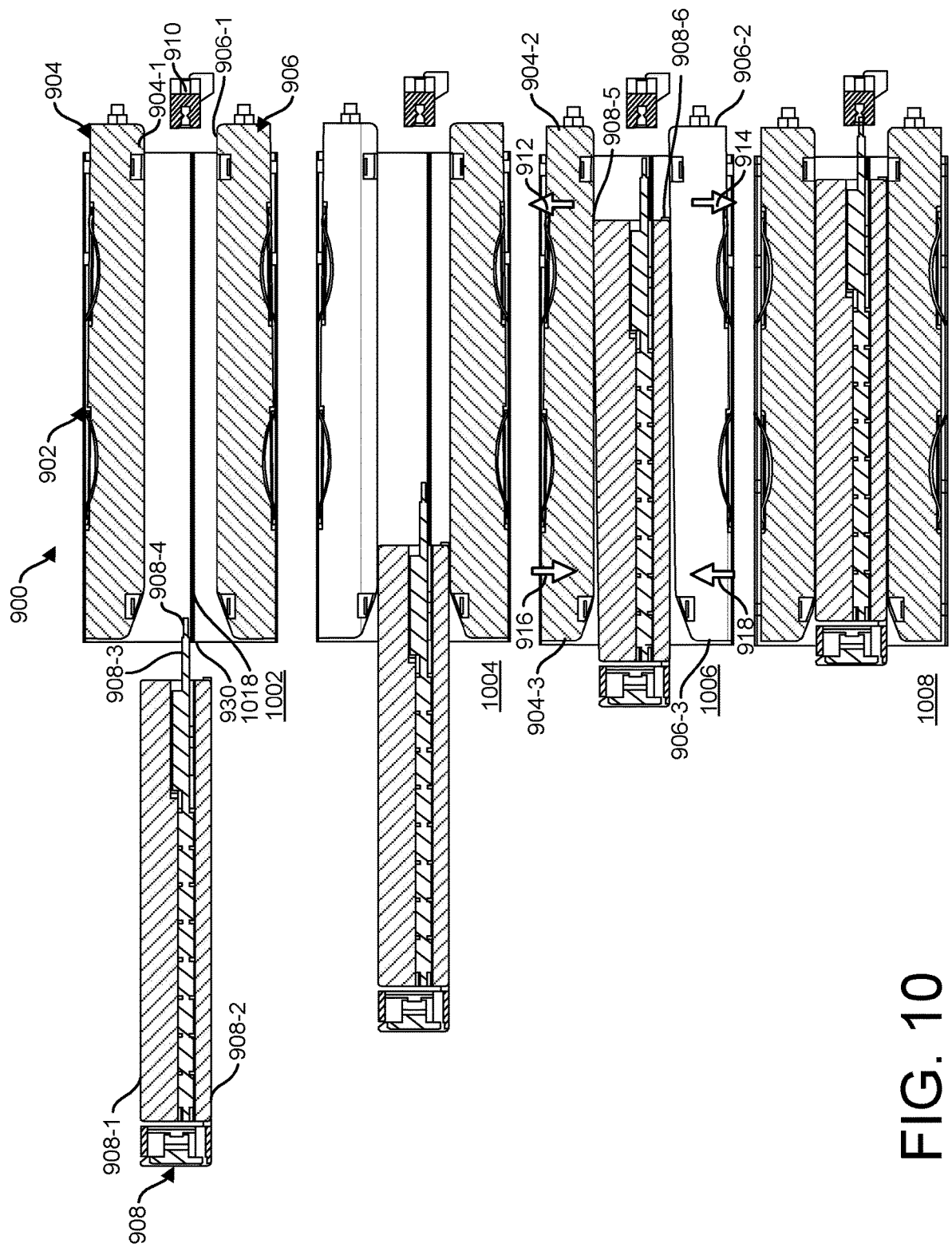
FIG. 10 depicts a side views of a pluggable module being installed within a computing device having a liquid-cooled cold plate assembly, the installing using guide rails, according to one or more examples of the present disclosure.

FIG. 10 depicts side views 1002, 1004, 1006, and 1008 of the pluggable module 908 of FIG. 9 being installed, using guide rails 1018, within a computing device 1000 having a cold plate assembly, according to one or more examples of the present disclosure. A guide rail 1018 may be a ledge formed on each of the sidewalls (not shown) of component cage 902. Each side of the panel 908-2 of the pluggable module 908 may rest on a corresponding rail 1018 when the pluggable module 908 is inserted in the component cage 902, where the majority of the mid portion of the panel 902-2 is exposed towards the mating surface 906-1 of the cold plate 906. The system 1000 includes identical elements as the system 900 of FIG. 9, with like parts bearing like numbers, but also includes the guide rails 1018, also referred to as a "rail." Only one rail 1018 is shown in these side views.

The view 1002 is similar to the view 920 of FIG. 9. The view 1004 is similar to the view 922 of FIG. 9 except that the surface of the panel 908-2 of the pluggable module 908 rests on or engages the rail 1018 instead of the mating surface 906-1 of the cold plate 906 upon initial insertion into the component cage 902. The view 1006 is similar to the view 924 of FIG. 9, except that the panel 908-2 of the pluggable module 908 fully rests on the rail 1018 with the only contact of the panel 908-2 being the posterior end 908-6. The view 1008 is similar to the view 926 of FIG. 9. A benefit of including the rails 1018 within the system the 1000 may be further reduced friction, as compared to the system 900, between the pluggable module 908 and the cold plates 904 and 906 as the pluggable module 908 is inserted into the component cage 902.

Figure 11:
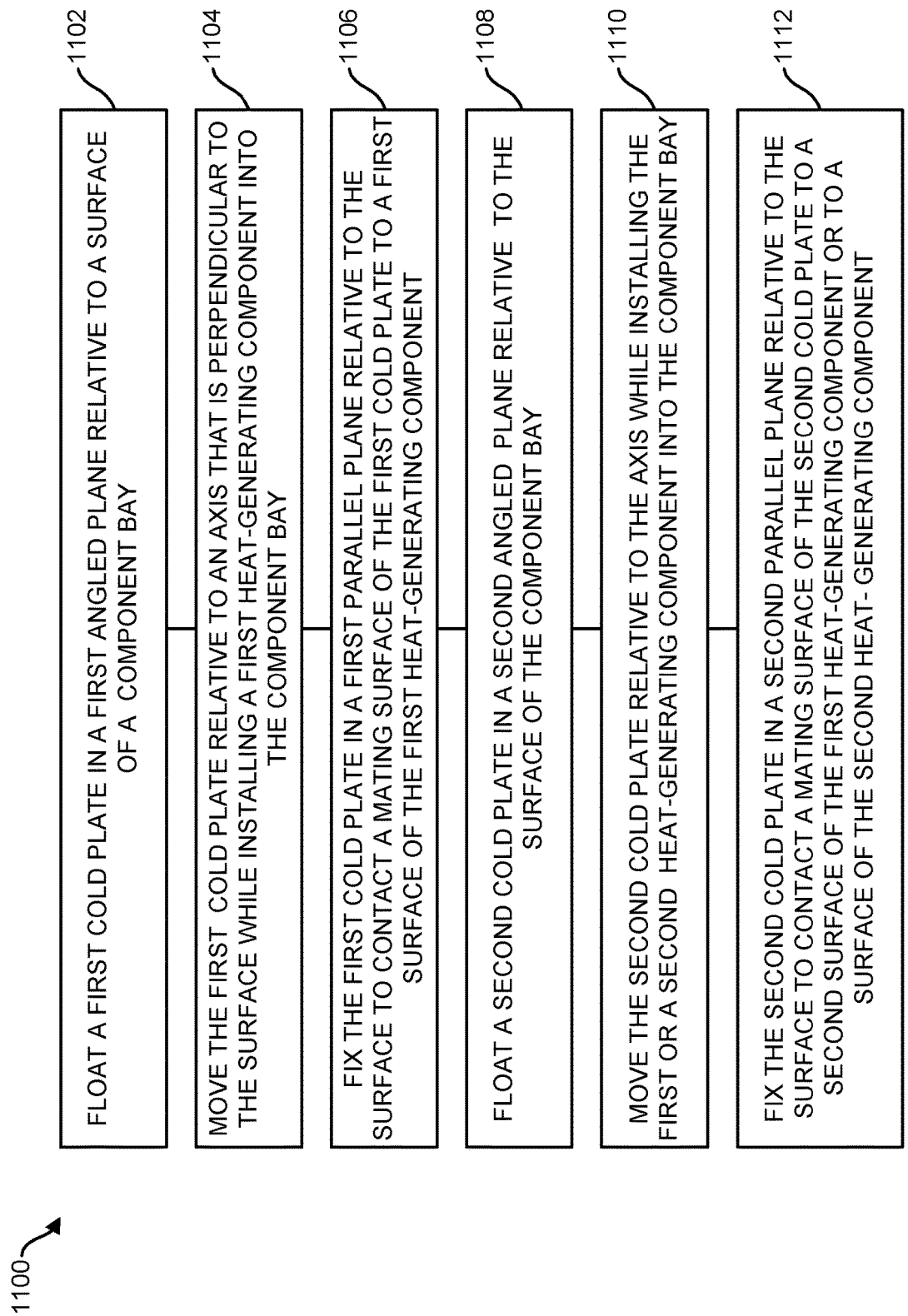
FIG. 11 depicts a flow diagram illustrating a method of operation of a liquid-cooled cold plate assembly mounted within a component cage of a computing device, according to one or more examples of the present disclosure.

FIG. 11 depicts a flow diagram illustrating a method 1100 of operation of a cold plate assembly mounted within a component cage of a computing device, according to one or more examples of the present disclosure. The cold plate assemblies described by reference to FIGS. 1-10 may operate according to the method 1100. The method 1100 includes floating 1102 a first cold plate of the cold plate assembly in a first angled plane relative to a surface of the component cage to which the first cold plate is mounted. The method 1100 further includes moving 1104 the first cold plate relative to an axis that is perpendicular to the surface of the component cage. The moving is during installation of a first heat-generating component into the component cage. The method 1100 also includes fixing 1106 the first cold plate in a first parallel plane relative to the surface of the component cage to contact a mating surface of the first cold plate to a first surface of the first heat-generating component. The first cold plate is fixed in the first parallel plane when the first heat-generating component engages a connector of the computing device.

Where the cold plate assembly includes a second cold plate, the method 1100 may include floating 1108 the second cold plate in a second angled plane relative to the surface of the component cage. The method 1100 may further include moving 1110 the second cold plate relative to the axis during installation of the first heat-generating component or a second heat-generating component into the component cage. The method 1100 may further include fixing 1112 the second cold plate in a second parallel plane relative to the surface of the component cage to contact a mating surface of the second cold plate to a second surface of the first heat-generating component or to a surface of the second heat-generating component.

Figure 12:
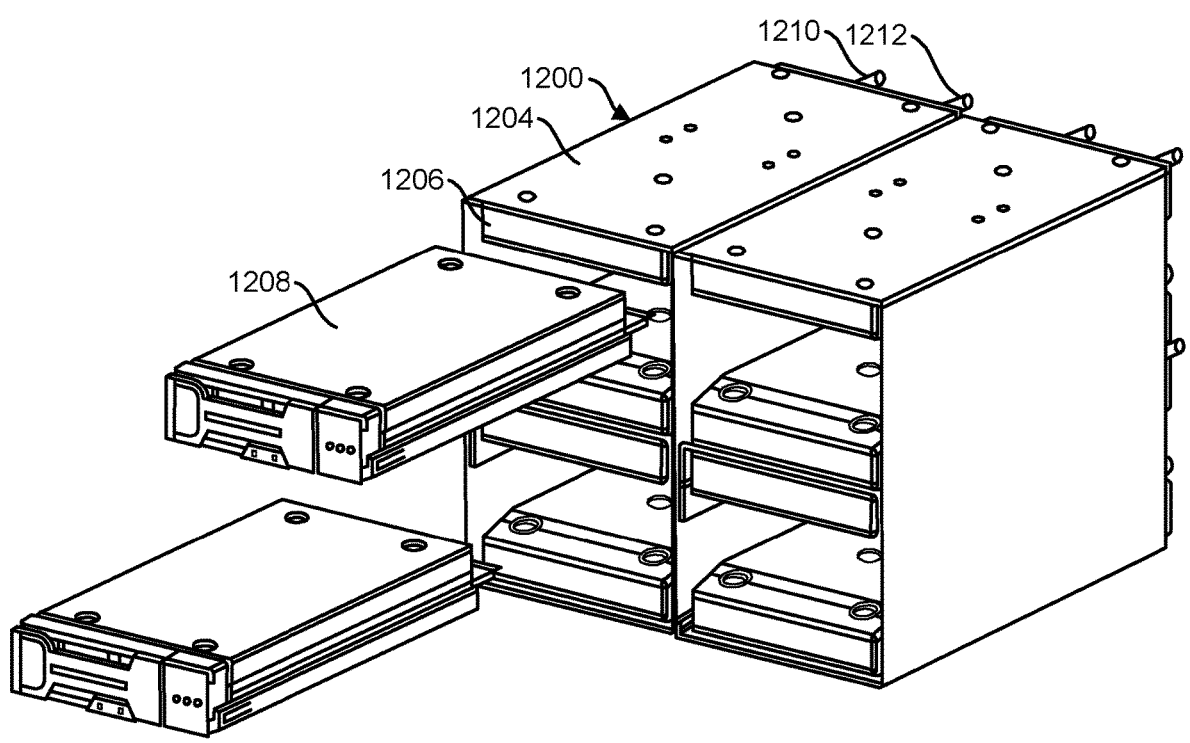
FIG. 12 depicts a system having multiple component cages each including a liquid-cooled cold plate assembly, according to one or more examples of the present disclosure.

FIG. 12 depicts a system 1200 having two side-by-side adjacent component cages 1204 (only one labeled) each including a cold plate assembly, according to one or more examples of the present disclosure. Each component cage 1204 has mounted therein a cold plate assembly including four cold plates 1206 (only one labeled). Four pluggable modules 1208 (only two shown) will be installed in the computing device 1200. In this example, the component cages 1204 may be arranged side-by-side within a chassis (not shown). "Side-by-side" means that surfaces of adjacent component cages may contact, which is possible due to the mounting mechanisms (not shown) being internal to the component cages 1204. In another example (not shown), the component cages 1204 may be stacked on top of one another within a chassis. Additionally, a common set of fixed supply 1210 and return 1212 lines may be used for the cold plates 1206 of adjacent component cages 1204.

Figure 13:
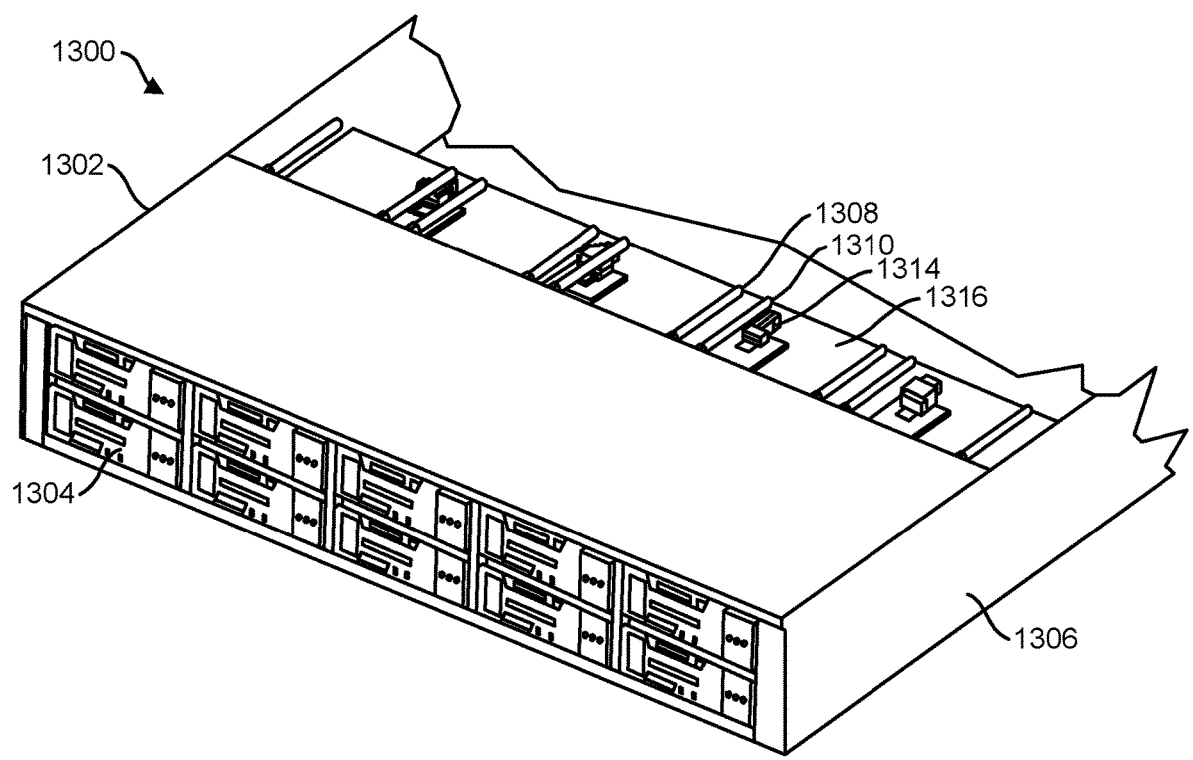
FIG. 13 depicts a system having a component cage with multiple bays each including one or more floating liquid-cooled cold plates, according to one or more examples of the present disclosure.
Figure 14:
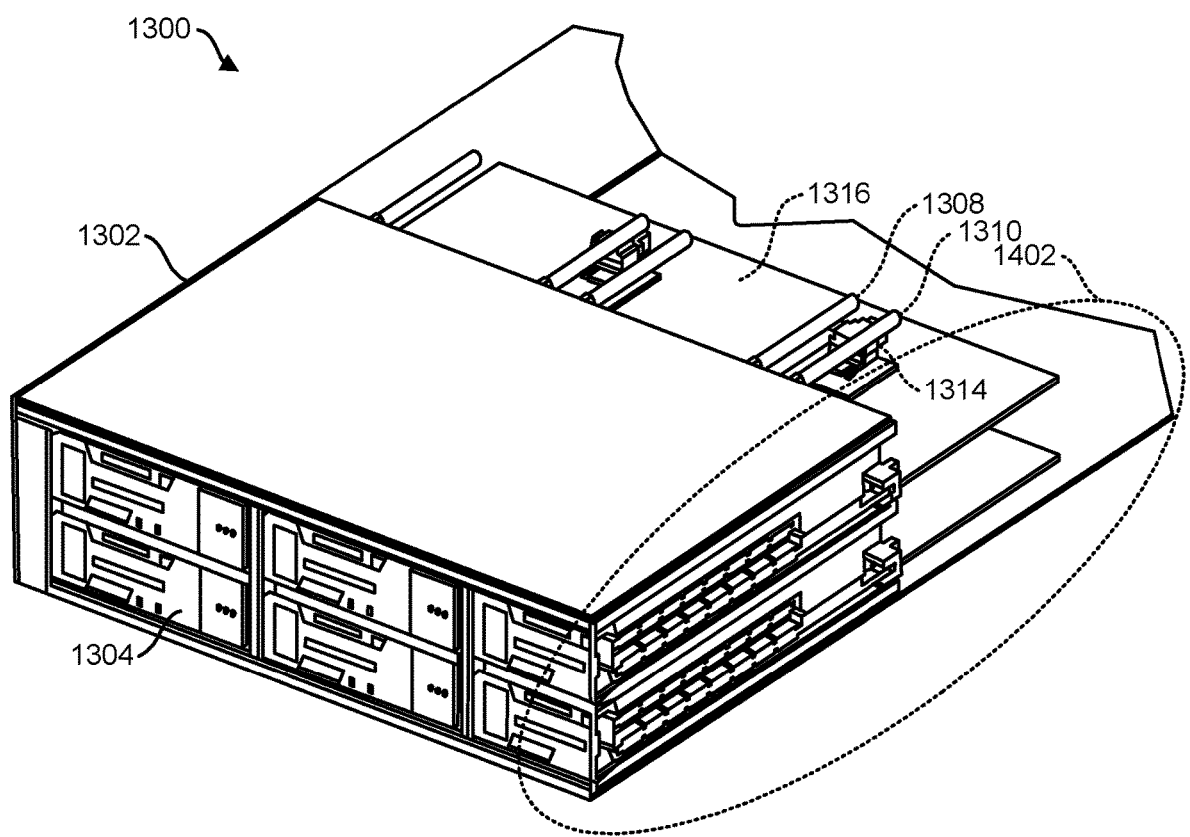
FIG. 14 depicts a cut-away view of the system depicted in FIG. 13, according to one or more examples of the present disclosure.
Figure 15:
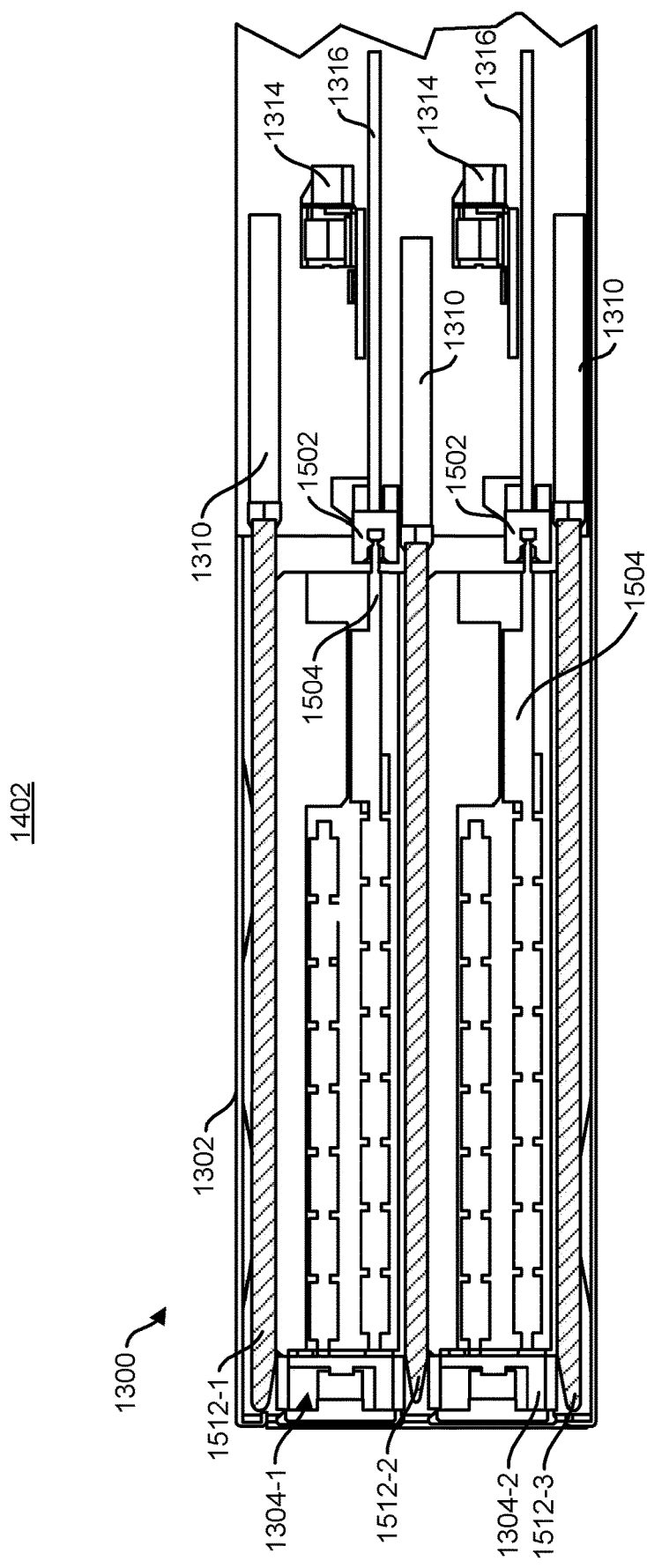
FIG. 15 depicts a side view of the system depicted in FIGS. 13 and 14, according to one or more examples of the present disclosure.

FIG. 13 depicts a system 1300 having a component cage 1302 with multiple bays each including one or more floating cold plates (not shown), according to one or more examples of the present disclosure. As illustrated, the system 1300 includes ten pluggable modules 1304 installed in respective bays of the component cage 1302. The system 1300 further includes supply lines 1308 (only one labeled) and return lines 1310 (only one labeled) to flow a liquid coolant into and out of the cold plates mounted within the component cage. The system 1300 further includes electrical to optical ("DO") converters 1314 (only one labeled) mounted and electrically connected to a module interface ("I/F") board 1316. Five pluggable modules 1304 may be electrically connected to each I/F board 1316. FIGS. 14 and 15 illustrate additional details of the system 1300.

FIG. 14 depicts a cut-away view from a side 1306 of the system 1300 depicted in FIG. 13, according to one or more examples of the present disclosure. FIG. 15 depicts a partial view 1402 of the electronic device 1300 depicted in FIG. 14, according to one or more examples of the present disclosure. View 1402 illustrates a side view of two of the bays of the component cage 1302. The partial view 1402 illustrates a cold plate assembly having three cold plates 1512-1, 1512-2, and 1512-3, collectively referred to as cold plates 1512, mounted within the component cage 1302. The return lines 1310 are coupled to the cold plates 1512.

As illustrated, the cold plates 1512-1 and 1512-3 may be floating cold plates movably mounted within the component cage 1302. The cold plate 1512-2 may be fixably mounted to the component cage 1302 to separate two bays of the component cage 1302. For example, the cold plate 1512-2 may be attached to the component cage 1302 using any suitable attachment mechanism such as screws. The cold plates 1512-1 and 1512-3 may be mounted using the mounting mechanism described by reference to FIGS. 4-7. The cold plate assembly may operate in accordance with the method 1100 described by reference to FIG. 11.

As illustrated, a pluggable module 1304-1 is fully installed between the cold plates 1512-1 and 1512-2 such that a PCA 1504 of the pluggable module 1304-1 electrically connects to a connector 1502 to electrically connect to an I/F board 1316 of the system 1300. Accordingly, a mating surface of the cold plate 1512-1 contacts and is parallel to a surface of the pluggable module 1304-1 and to a mounting plane. A mating surface of the cold plate 1512-2 contacts and is parallel to an opposing surface of the pluggable module 1304-1. When the pluggable module 1304-1 is not installed, the mating surface of the cold plate 1512-1 is inclined relative to the mounting plane. However, the pluggable module 1304-1 moves the cold plate 1512-1 as the pluggable module 1304-1 is inserted such that the mating surface of the cold plate 1512-1 is parallel to the mounting plane when the pluggable module 1304-1 is fully installed.

As further illustrated, a pluggable module 1304-2 is fully installed between the cold plates 1512-2 and 1512-3 such that a PCA 1504 of the pluggable module 1304-2 electrically connects to a connector 1502 to electrically connect to an I/F board 1316 of the system 1300. Accordingly, a mating surface of the cold plate 1512-3 contacts and is parallel to a surface of the pluggable module 1304-2 and to a mounting plane. A opposing mating surface of the cold plate 1512-2 contacts and is parallel to an opposing surface of the pluggable module 1304-2. When the pluggable module 1304-2 is not installed, the mating surface of the cold plate 1512-3 is inclined relative to the mounting plane. However, the pluggable module 1304-2 moves the cold plate 1512-3 as the pluggable module 1304-2 is inserted such that the mating surface of the cold plate 1512-3 is parallel to the mounting plane when the pluggable module 1304-2 is fully installed.

The I/F boards 1316 may provide an electrical signal, a management signal, and a power interface to the pluggable modules 1304. Electric signals from the pluggable modules 1304 may be converted to optical signals using the E/O converters 1314. The optical signals may be routed to local compute nodes via an optical midplane connection, local switches with optical interfaces, remote switches or compute nodes, and/or faceplate optical connectors on the pluggable modules 1304.

The systems 100 (FIG. 1), 200 (FIGS. 2 and 3) and 1300 (FIGS. 13-15) illustrate pluggable modules inserted between two cold plates. For example, the systems 100, 200, and 1300 may be suitable for cooling pluggable modules rated at higher power, e.g., 75 Watts, which may have electronics or circuitry on both sides of the PCA. However, the system 1300 has an added benefit of having a lower profile than systems 100 and 200 by using fewer cold plates (three instead of four) to cool two pluggable modules.

Figure 16:
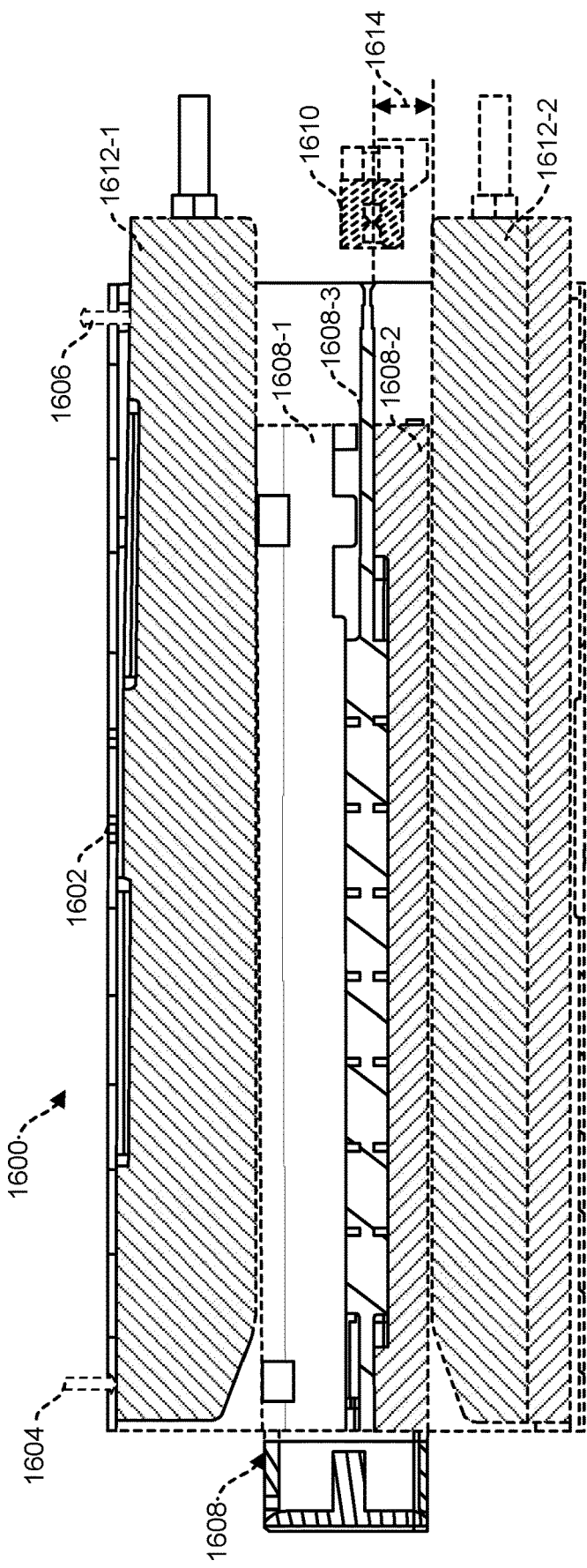
FIG. 16 depicts a side view of a computing device with one floating liquid-cooled cold plate and one fixed liquid-cooled cold plate, according to one or more examples of the present disclosure.

FIG. 16 depicts a side view of a computing device 1600 with a cold plate assembly having one floating cold plate 1612-1 and one fixed cold plate 1612-2 mounted within a component cage 1602, according to one or more examples of the present disclosure. The cold plates 1612-1 and 1612-2 are collectively referred to as cold plates 1612. The computing device 1600 may be suitable for cooling a pluggable module rated at higher power.

As illustrated, a pluggable module 1608 is partially installed between the cold plates 1612. Accordingly, a mating surface of the cold plate 1612-1 partially contacts a surface of a panel 1608-1 of the pluggable module 1608. A mating surface of the cold plate 1612-2 contacts and may be parallel to a surface of a panel 1608-2 of the pluggable module 1608, as the pluggable module 1608 rests on the cold plate 1612-2 during insertion.

When the pluggable module 1608 is not installed, the mating surface of the cold plate 1612-1 is inclined relative to a mounting plane, and the mating surface of the cold plate 1612-2 is parallel to the mounting plane. However, the pluggable module 1608 moves the cold plate 1612-1 as the pluggable module 1608 is inserted (as indicated by arrows 1604 and 1606) such that the mating surface of the cold plate 1612-1 is parallel to the mounting plane when the pluggable module 1608 is fully installed. When fully installed a PCA 1608-3 of the pluggable module 1608 electrically connects to a connector 1610 of the computing device 1600. Moreover, a height of the PCA 1608-3 above the mating surface of the cold plate 1612-2 aligns with a center reference of the connector 1610, as illustrated by dashed lines and an arrowed line labeled 1614.

Figure 17:
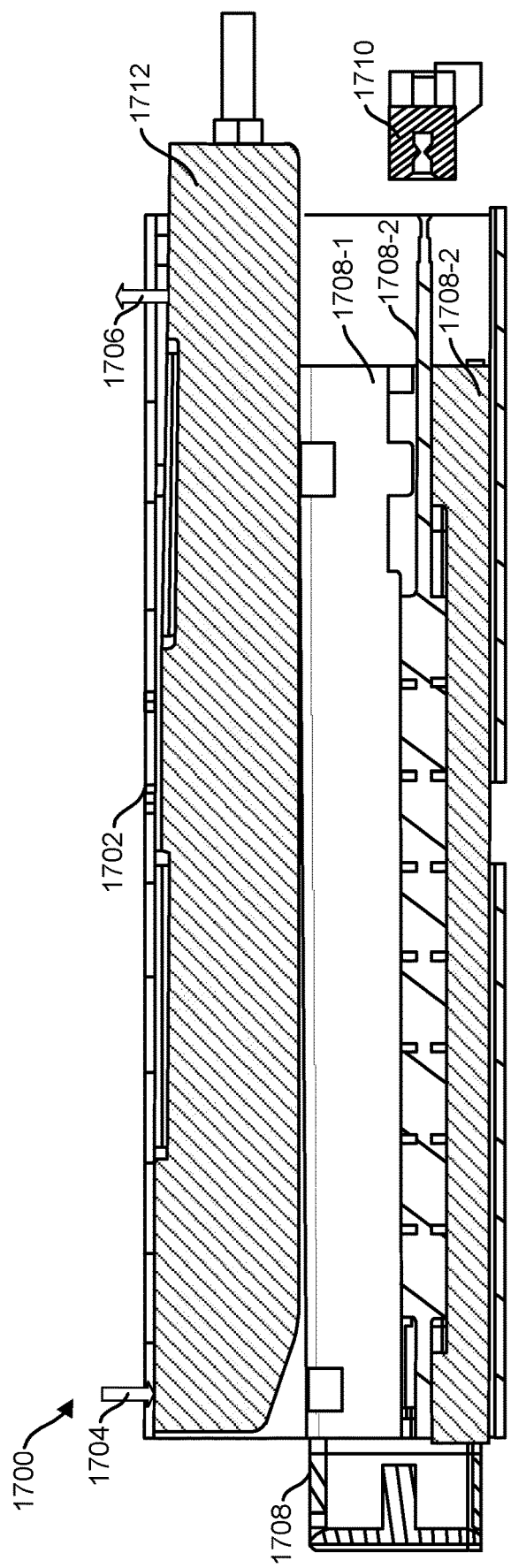
FIG. 17 depicts a side view of a computing device with one floating liquid-cooled cold plate, according to one or more examples of the present disclosure.

FIG. 17 depicts a side view of a computing device 1700 with a cold plate assembly having a single floating cold plate 1712 mounted within a component cage 1702, according to one or more examples of the present disclosure. The computing device 1700 may be suitable for cooling a pluggable module rated at lower power, e.g., 25 Watts, which may have electronics or circuitry on one side of the PCA.

As illustrated, a pluggable module 1708 is partially installed between the cold plate 1712 and a surface of the component cage 1702. Accordingly, a mating surface of the cold plate 1712 partially contacts a surface of a panel 1708-1 of the pluggable module 1708. The surface of the component cage 1702 contacts and may be parallel to a surface of a panel 1708-2 of the pluggable module 1708, as the pluggable module 1708 rests on the surface during insertion. When the pluggable module 1708 is not installed, the mating surface of the cold plate 1712 is inclined relative to a mounting plane. However, the pluggable module 1708 moves the cold plate 1712 as the pluggable module 1708 is inserted (as indicated by arrows 1704 and 1706) such that the mating surface of the cold plate 1712 is parallel to the mounting plane when the pluggable module 1708 is fully installed When fully installed a PCA 1708-3 of the pluggable module 1708 electrically connects to a connector 1710 of the computing device 1700.

Figure 18:
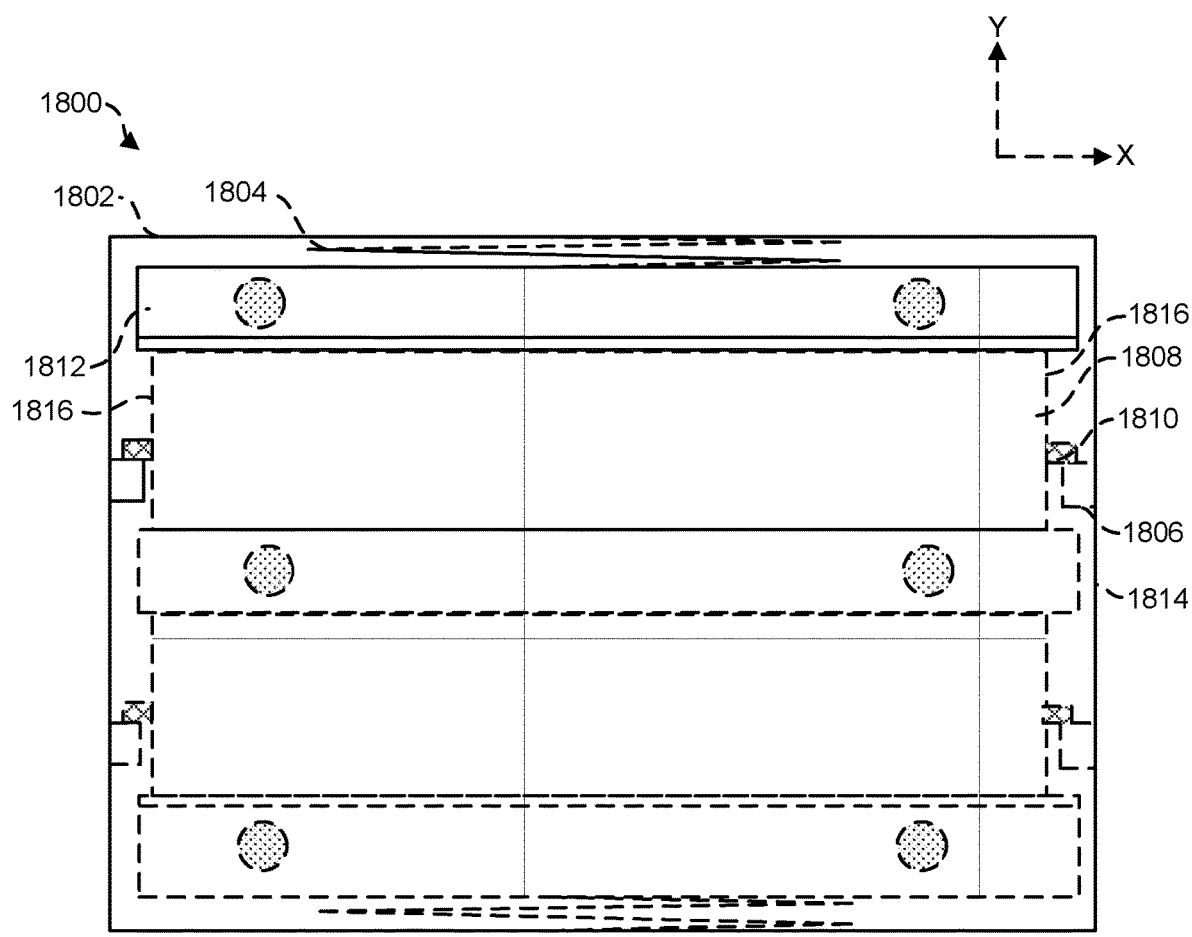
FIG. 18 depicts a front view of guide rails used to install pluggable modules within a computing device having multiple floating liquid-cooled cold plates, according to one or more examples of the present disclosure.

FIG. 18 depicts a front view, along an XY-axis, of guide rails 1806 (only one labeled) used to install pluggable modules 1808 (only one labeled) within a computing device 1800 having multiple cold plates 1812 (only one labeled), according to one or more examples of the present disclosure. The computing device 1800 includes a component cage 1802 into which two floating cold plates 1812 are movably mounted into the component cage 1802 using a mounting mechanism 1804 (only one labeled), and one cold plate 1812 is fixably mounted between the two floating cold plates. The mounting mechanism 1804 is depicted as a spring but may be similar to the mounting mechanism having leaf springs, posts, and snap rings illustrated and described above.

FIG. 18 depicts an example of guide rails being attached to sidewalls of a component cage. As particularly illustrated, each guide rail 1806 is attached to a sidewall 1814 of the component cage 1802. Moreover, opposing sides 1816 of each pluggable module 1808 includes a ledge 1810 (only one labeled) that engages the guide rail 1806 while the pluggable module is being inserted into a slot between the cold plates 1812. As described earlier, the ledge 1810 may extend from a panel of the pluggable module 1808. Additionally, the engagement point between the ledge 1810 and guide rail 1806, along the sidewall 1814, may be different than that illustrated.

Figure 19:
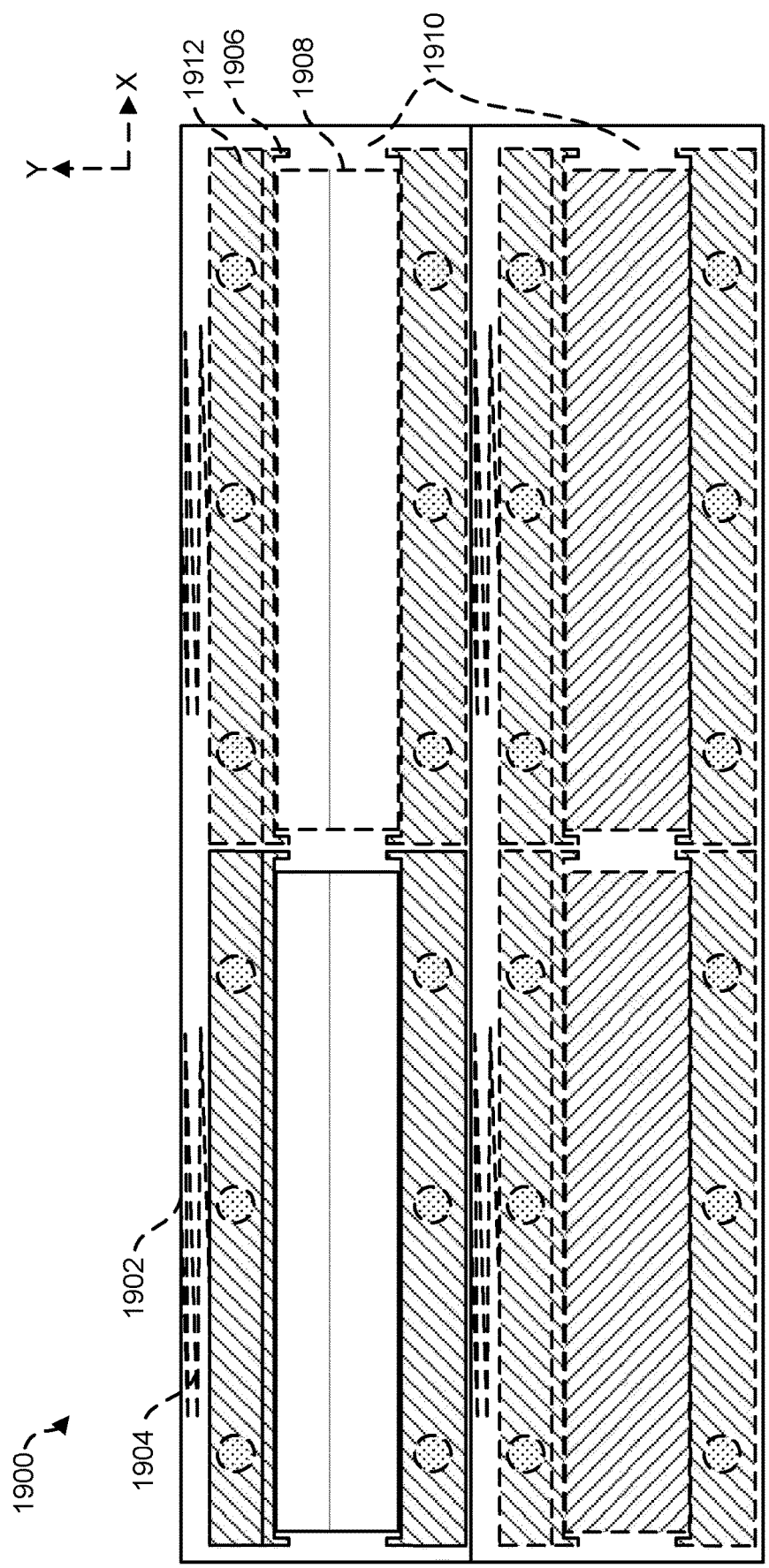
FIG. 19 depicts a front view of a computing device having multiple floating liquid-cooled cold plates, according to one or more examples of the present disclosure.

FIG. 19 depicts a front view, along an XY-axis, of a computing device 1900, according to one or more examples of the present disclosure. Computing device 1900 includes a component cage 1902 divided into two bays 1910. Within each bay 1910, two floating cold plates 1912 (only one labeled) are movably mounted using a mounting mechanism 1904 (only one labeled), and two cold plates 1912 are fixably mounted. The mounting mechanism 1904 is depicted as a spring but may be similar to the mounting mechanism having leaf springs, posts, and snap rings illustrated and described above.

Within each bay 1910, two pluggable modules 1908 are installed within two slots formed between the cold plates 1912, with the pluggable modules 1908 being arranged along the X-axis. Additionally, guide rails 1906 (only one labeled) extend from the cold plates 1912 to guide the pluggable modules 1908 during installation.

Figure 20:
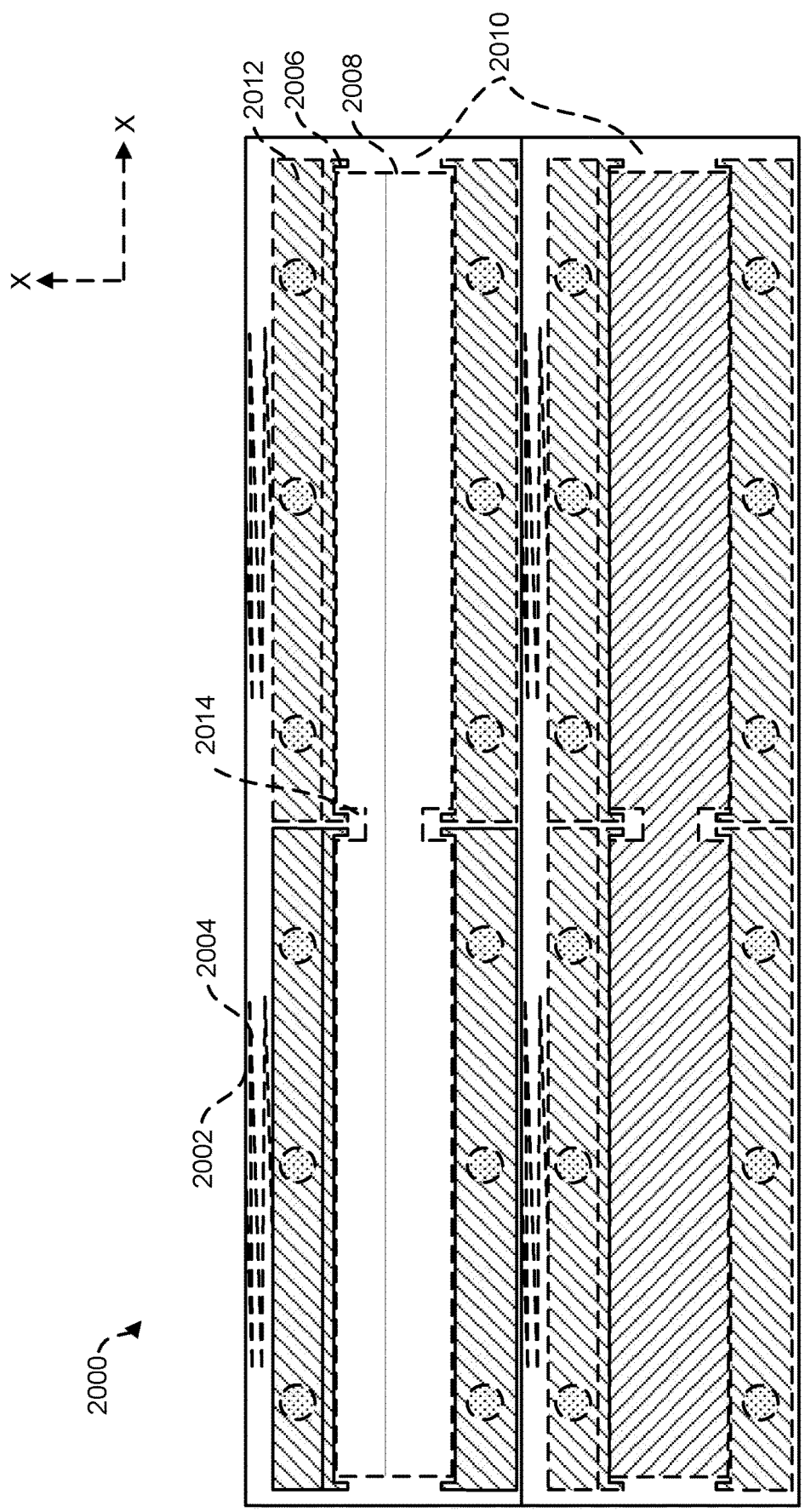
FIG. 20 depicts a front view of a computing device having multiple floating liquid-cooled cold plates, according to one or more examples of the present disclosure.

FIG. 20 depicts a front view, along an XY-axis, of a computing device, according to one or more examples of the present disclosure. Computing device 2000 includes a component cage 2002 divided into two bays 2010. Within each bay 2010, two floating cold plates 2012 (only one labeled) are movably mounted using a mounting mechanism 2004 (only one labeled), and two cold plates 2012 are fixably mounted. The mounting mechanism 2004 is depicted as a spring but may be similar to the mounting mechanism having leaf springs, posts, and snap rings illustrated and described above.

Within each bay 2010, one pluggable module 2008 is installed within a slot formed between the four cold plates 2012. In this arrangement, two cold plates 2012 contact and may cool the same surface of a pluggable module 2008. Guide rails 2006 (only one labeled) extend from the cold plates 2012 to guide the pluggable modules 2008 during installation. Additionally, each pluggable module 2008 includes notches 2014 (only one labeled) through which guide rails 2006 may slide during installation.

Additional benefits of systems and computing devices according to one or more examples of the present disclosure may include one or more of the following: minimizing friction while inserting and removing a pluggable module from a component cage; dry-connecting of pluggable modules eliminates leaks at connection points for liquid-cooled systems; same industry standard pluggable module may be used for air-cooled and liquid-cooled systems; lower profile provides larger contact area and efficient cooling surface for top and bottom surface mounted pluggable components, which may enable liquid cooling of higher powered pluggable modules in thinner form factor for high density employment; high number of easily insertable pluggable modules in a given chassis to make more room for system logic and plumbing; zero air flow solution; and simple mechanical design enables cost efficiency.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1% unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A system comprising: a component cage comprising one or more bays to house one or more heat-generating components, the component cage having a first surface located in a first plane; a liquid-cooled cold plate assembly comprising: a first liquid-cooled cold plate having a mating surface and a non-mating surface, the mating surface to contact a first heat-generating component when the first heat-generating component is installed in the component cage; and a mounting mechanism that movably mounts the first liquid-cooled cold plate to the component cage with the non-mating surface of the first liquid-cooled cold plate facing the first surface of the component cage, the mounting mechanism allowing the first liquid-cooled cold plate to move from a first orientation to a second orientation as the first heat-generating component is being installed in the component cage, wherein in the first orientation the mating surface is inclined relative to the first plane, and in the second orientation the mating surface is parallel to the first plane; wherein the mounting mechanism biases the first liquid-cooled cold plate into the first orientation when the first heat-generating component is not installed in the component cage.

2. The system of claim 1, wherein the mounting mechanism further comprise:
   a plurality of posts attached to the first surface of the component cage to mount the first liquid-cooled cold plate to the component cage through a corresponding plurality of holes in the first liquid-cooled cold plate; and
   a plurality of spring mechanisms disposed between the non-mating surface of the first liquid-cooled cold plate and the first surface of the component cage.

3. The system of claim 2, wherein the plurality of posts further comprise:
   a first set of one or more posts attached proximate an anterior end of the first surface of the component cage, the anterior end defining part of an opening to receive a first heat generating component; and
   a second set of one or more posts attached proximate a posterior end of the first surface of the component cage, which is opposite the anterior end, wherein a length of the one or more posts in the first set is shorter than a length of the one or more posts of the second set.

4. The system of claim 2, wherein the plurality of spring mechanisms further comprise a plurality of leaf spring mechanisms, each leaf spring comprising:
- a first leaf spring segment disposed within a first recess of the non-mating surface of the first liquid-cooled cold plate;
- a second leaf spring segment disposed within a second recess of the non-mating surface of the first liquid-cooled cold plate; and
- a central segment disposed between the first and second leaf spring segments and attached to the first surface of the component cage.

5. The system of claim 4, wherein the first leaf-spring segment generates a different spring force than does the second leaf spring segment.

6. The system of claim 2, wherein the plurality of posts each comprise a snap-ring collar, the mounting mechanism further comprising:
- a plurality of snap rings engaging the snap-ring collars of the plurality of posts.

7. A computing device, comprising:
- a component cage comprising one or more bays to house pluggable modules; and
- a liquid-cooled cold plate assembly comprising a first liquid-cooled cold plate having a mating surface to contact and cool a first pluggable module of the pluggable modules when the first pluggable module is installed in a first bay of the bays, the first liquid-cooled cold plate being movably mounted to the component cage such that:
  - the mating surface is inclined relative to a mounting plane when the first pluggable module is not installed in the first bay; and
  - the first pluggable module moves the first liquid-cooled cold plate as the first pluggable module is inserted into the first bay such that the mating surface is parallel to the mounting plane when the first pluggable module is fully installed.

8. The computing device of claim 7, wherein the liquid-cooled cold plate assembly further comprises:
- a second liquid-cooled cold plate having a mating surface to contact and cool the first pluggable module when the first pluggable module is installed in the first bay, the second liquid-cooled cold plate being movably mounted to the component cage such that:
  - the mating surface of the second liquid-cooled cold plate is inclined relative to the mounting plane when the first pluggable module is not installed in the first bay; and
  - the first pluggable module moves the second liquid-cooled cold plate as the first pluggable module is inserted into the first bay such that the mating surface of the second liquid-cooled cold plate is parallel to the mounting plane when the first pluggable module is fully installed.

9. The computing device of claim 8, wherein the first and second liquid-cooled cold plates are mounted to allow their mating surfaces to contact a same surface of the first pluggable module.

10. The computing device of claim 7, wherein the liquid-cooled cold plate assembly further comprises:
- a second liquid-cooled cold plate having a mating surface to contact and cool the first pluggable module when the first pluggable module is installed in the first bay, the second liquid-cooled cold plate being fixably mounted to the component cage such that the mating surface of the second liquid-cooled cold plate is parallel to the mounting plane when the first pluggable module is not installed and when the first pluggable module is fully installed in the first bay.

11. The computing device of claim 7, wherein the first bay comprises a surface, parallel to the mounting surface to contact the first pluggable module when the first pluggable module is installed in the first bay.

12. The computing device of claim 7, wherein the liquid-cooled cold plate assembly further comprises:
- a second liquid-cooled cold plate having a mating surface to contact and cool a second pluggable module when the second pluggable module is installed in a second bay of the bays, the second liquid-cooled cold plate being movably mounted to the component cage such that:
  - the mating surface of the second liquid-cooled cold plate is inclined relative to the mounting plane when the second pluggable module is not installed in the first bay; and
  - the second pluggable module moves the second liquid-cooled cold plate as the second pluggable module is inserted into the second bay such that the mating surface of the second liquid-cooled cold plate is parallel to the mounting plane when the second pluggable module is fully installed; and
- a third liquid-cooled cold plate fixably mounted parallel to the mounting plane between the first and second liquid-cooled cold plates and having a first mating surface and a second mating surface, the first mating surface to contact the first pluggable module when the first pluggable module is installed in the first bay, and the second mating surface to contact the second pluggable module when the second pluggable module is installed in the second bay.

13. The computing device of claim 7, wherein:
- the component cage comprises a bay separator positioned parallel to the mounting plane and separating the first bay from a second bay of the bays, wherein the first liquid-cooled cold plate is movably mounted to a first side of the bay separator; and
- the liquid-cooled cold plate assembly further comprising a second liquid-cooled cold plate having a mating surface to contact and cool a second pluggable module of the pluggable modules when the second pluggable module is installed in the second bay, the second liquid-cooled cold plate being movably mounted to a second side of the bay separator such that:
  - the mating surface of the second liquid-cooled cold plate is inclined relative to the mounting plane when the second pluggable module is not installed in the first bay; and
  - the second pluggable module moves the second liquid-cooled cold plate as the second pluggable module is inserted into the second bay such that the mating surface of the second liquid-cooled cold plate is parallel to the mounting plane when the second pluggable module is fully installed.

14. The computing device of claim 13, further comprising a plurality of posts mounting the first and second liquid-cooled cold plate to the bay separator, each post extending through corresponding aligned holes in the first and second liquid-cooled cold plates.

15. The computing device of claim 7, wherein the component cage further comprises:
- a plurality of rails to engage the first pluggable module while being installed in the first bay.

16. The computing device of claim 7, wherein the first liquid-cooled cold plate comprises a plurality of surfaces forming an enclosure for contain a liquid coolant, the plurality of surfaces comprising:
   the mating surface;
   a non-mating surface parallel to the mating surface, the non-mating surface having formed therein a plurality of recesses to contact a plurality of spring mechanisms to movably mount the first liquid-cooled cold plate, the plurality of recesses being positioned between a first plurality of oblong-shaped holes and a second plurality of oblong-shaped holes formed through the first liquid-cooled cold plate perpendicular to the mating and non-mating surfaces, wherein the first plurality of oblong-shaped holes are shorter than the second plurality of oblong-shaped holes;
   an anterior surface perpendicular to the mating and non-mating surfaces; and
   a posterior surface perpendicular the mating and non-mating surfaces, the posterior surface having formed therein an inlet and an outlet for the liquid coolant.

17. The computing device of claim 16, wherein the plurality of surfaces further comprise:
   an angled surface connecting the anterior surface to the mating surface, wherein the first plurality of holes is formed through the angled surface.

18. The computing device of claim 16, wherein:
   the first plurality of oblong-shaped holes are centered within a first plurality of recesses, formed in the mating surface, and have a diameter that is larger than a diameter of each oblong-shaped hole in the first plurality; and
   the second plurality of oblong-shaped holes are centered within a second plurality of recesses, formed in the mating surface, and having a diameter that is larger than a diameter of each oblong-shaped hole in the second plurality.

19. The computing device of claim 7, wherein the first liquid-cooled cold plate comprises:
   a plurality of rails to engage the first pluggable module while being installed in the first bay.

20. A method of operation of a liquid-cooled cold plate assembly mounted within a component cage of a computing device, the method comprising:
   floating a first liquid-cooled cold plate of the liquid-cooled cold plate assembly in a first angled plane relative to a surface of the component cage to which the first liquid-cooled cold plate is mounted;
   moving the first liquid-cooled cold plate relative to an axis that is perpendicular to the surface of the component cage, wherein the moving is during installation of a first heat-generating component into the component cage; and
   fixing the first liquid-cooled cold plate in a first parallel plane relative to the surface of the component cage to contact a mating surface of the first liquid-cooled cold plate to a first surface of the first heat-generating component.

21. The method of claim 20, wherein the first liquid-cooled cold plate is fixed in the first parallel plane when the first heat-generating component engages a connector of the computing device.

22. The method of claim 20, further comprising:
   floating a second liquid-cooled cold plate of the liquid-cooled cold plate assembly in a second angled plane relative to the surface of the component cage;
   moving the second liquid-cooled cold plate relative to the axis during installation of the first heat-generating component or a second heat-generating component into the component cage; and
   fixing the second liquid-cooled cold plate in a second parallel plane relative to the surface of the component cage to contact a mating surface of the second liquid-cooled cold plate to a second surface of the first heat-generating component or to a surface of the second heat-generating component.

* * * * *